(12) United States Patent
Jahja et al.

(10) Patent No.: US 11,749,627 B2
(45) Date of Patent: Sep. 5, 2023

(54) SEMICONDUCTOR PACKAGE HAVING A SIDEWALL CONNECTION

(71) Applicant: STMICROELECTRONICS LTD, Hong Kong (HK)

(72) Inventors: Endruw Jahja, Zhubei (TW); Cheng-Yang Su, Hukou Township, Hsinchu County (TW)

(73) Assignee: STMICROELECTRONICS LTD, Kowloon (HK)

( * ) Notice: Subject to any disclaimer, the term of this patent is extended or adjusted under 35 U.S.C. 154(b) by 0 days.

(21) Appl. No.: 17/513,541

(22) Filed: Oct. 28, 2021

(65) Prior Publication Data
US 2022/0051998 A1 Feb. 17, 2022

Related U.S. Application Data

(63) Continuation of application No. 16/706,594, filed on Dec. 6, 2019, now Pat. No. 11,195,809.

(60) Provisional application No. 62/785,841, filed on Dec. 28, 2018.

(51) Int. Cl.
*H01L 23/00* (2006.01)
(52) U.S. Cl.
CPC .............. *H01L 24/02* (2013.01); *H01L 24/05* (2013.01); *H01L 24/13* (2013.01); *H01L 24/14* (2013.01); *H01L 24/73* (2013.01); *H01L 24/92* (2013.01); *H01L 2224/02311* (2013.01); *H01L 2224/02371* (2013.01); *H01L 2224/0401* (2013.01); *H01L 2224/05024* (2013.01); *H01L 2224/05124* (2013.01); *H01L 2224/05147* (2013.01); *H01L 2224/05155* (2013.01); *H01L 2224/05166* (2013.01); *H01L 2224/05171* (2013.01); *H01L 2224/13026* (2013.01);
(Continued)

(58) Field of Classification Search
CPC ........................................................ H01L 24/02
See application file for complete search history.

(56) References Cited

U.S. PATENT DOCUMENTS 6,608,374 B1 * 8/2003 Lin .......................... H01L 24/82
257/690
8,294,252 B1 10/2012 Patel
9,123,543 B1 * 9/2015 Jin ...................... H01L 23/3192
(Continued)

OTHER PUBLICATIONS

U.S. Appl. No. 16/706,594, filed Dec. 6, 2019.

*Primary Examiner* — William A Harriston
(74) *Attorney, Agent, or Firm* — SEED IP LAW GROUP LLP

(57) ABSTRACT

A fan-out wafer level package includes a semiconductor die with a redistribution layer on a sidewall of the semiconductor die. A redistribution layer positioned over the die includes an extended portion that extends along the sidewall. The semiconductor die is encapsulated in a molding compound layer. The molding compound layer is positioned between the extended portion of the redistribution layer and the sidewall of the semiconductor die. Solder contacts, for electrically connecting the semiconductor device to an electronic circuit board, are positioned on the redistribution layer. The solder contacts and the sidewall of the redistribution layer can provide electrical contact on two different locations. Accordingly, the package can be used to improve interconnectivity by providing vertical and horizontal connections.

20 Claims, 11 Drawing Sheets

(52) U.S. Cl.
CPC .............. *H01L 2224/14183* (2013.01); *H01L 2224/73253* (2013.01); *H01L 2224/92225* (2013.01)

(56) References Cited

U.S. PATENT DOCUMENTS

| | | | |
|---|---|---|---|
| 9,478,524 B2* | 10/2016 | Cheah | H01L 24/17 |
| 9,484,279 B2* | 11/2016 | Pagaila | H01L 23/5286 |
| 11,373,977 B1* | 6/2022 | Bean | H01L 23/3157 |
| 2002/0109133 A1 | 8/2002 | Hikita et al. | |
| 2004/0115920 A1 | 6/2004 | Yamazaki et al. | |
| 2008/0315407 A1* | 12/2008 | Andrews, Jr. | H01L 25/0657 |
| | | | 257/777 |
| 2009/0026591 A1 | 1/2009 | Lee et al. | |
| 2011/0198732 A1* | 8/2011 | Lin | H01L 21/6835 |
| | | | 257/621 |
| 2012/0091575 A1 | 4/2012 | Lai et al. | |
| 2013/0075915 A1* | 3/2013 | Kim | H01L 24/16 |
| | | | 257/773 |
| 2014/0332983 A1* | 11/2014 | Ho | H01L 29/0657 |
| | | | 438/126 |
| 2015/0130084 A1 | 5/2015 | Liao | |
| 2015/0262931 A1* | 9/2015 | Vincent | H01L 21/6836 |
| | | | 257/773 |
| 2015/0279808 A1* | 10/2015 | Shen | H01L 24/05 |
| | | | 257/773 |
| 2015/0311175 A1 | 10/2015 | Ho et al. | |
| 2017/0186712 A1 | 6/2017 | Shen et al. | |
| 2021/0210538 A1* | 7/2021 | Lai | H01L 27/14618 |
| 2021/0305158 A1* | 9/2021 | Wagner | H01L 23/585 |

* cited by examiner

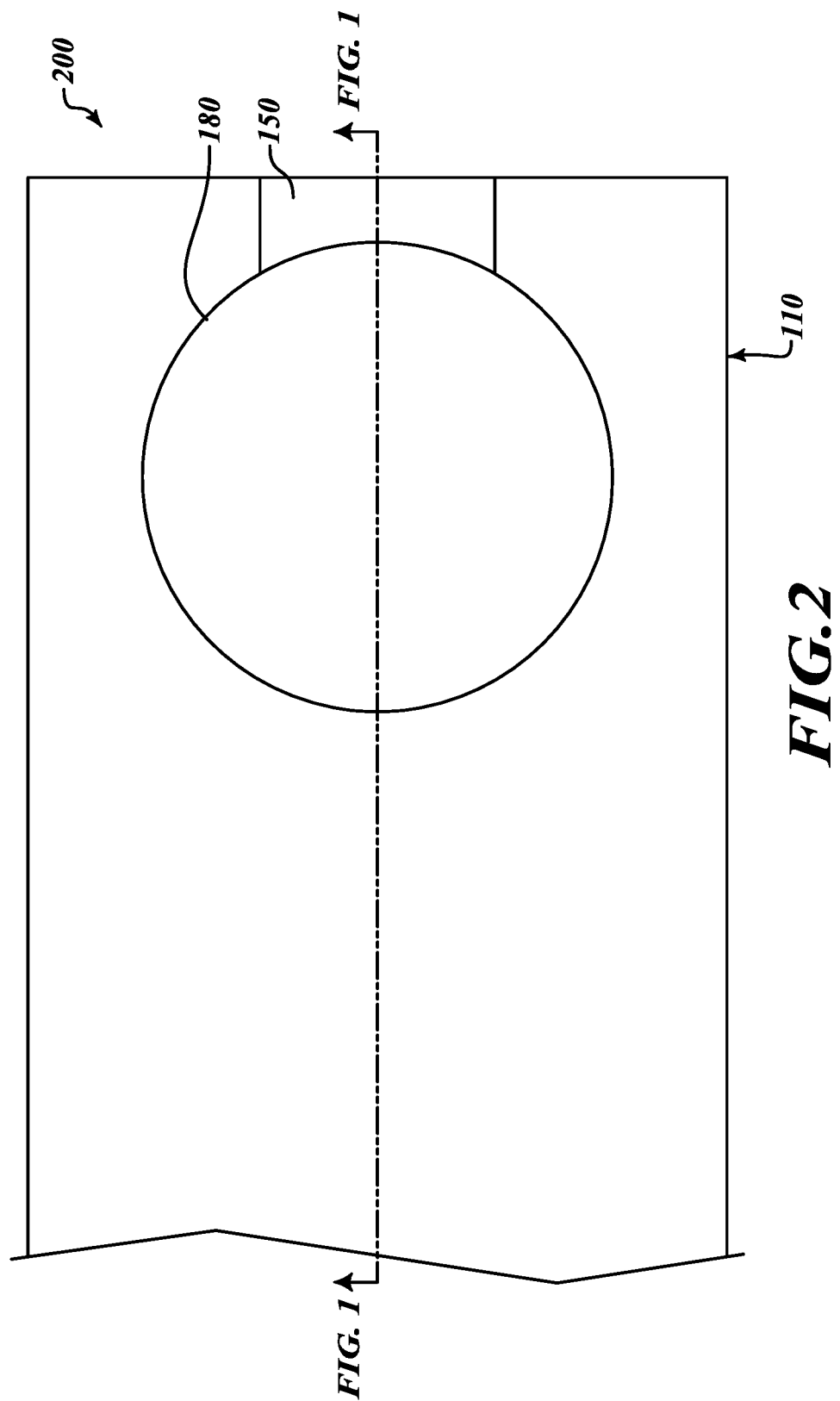

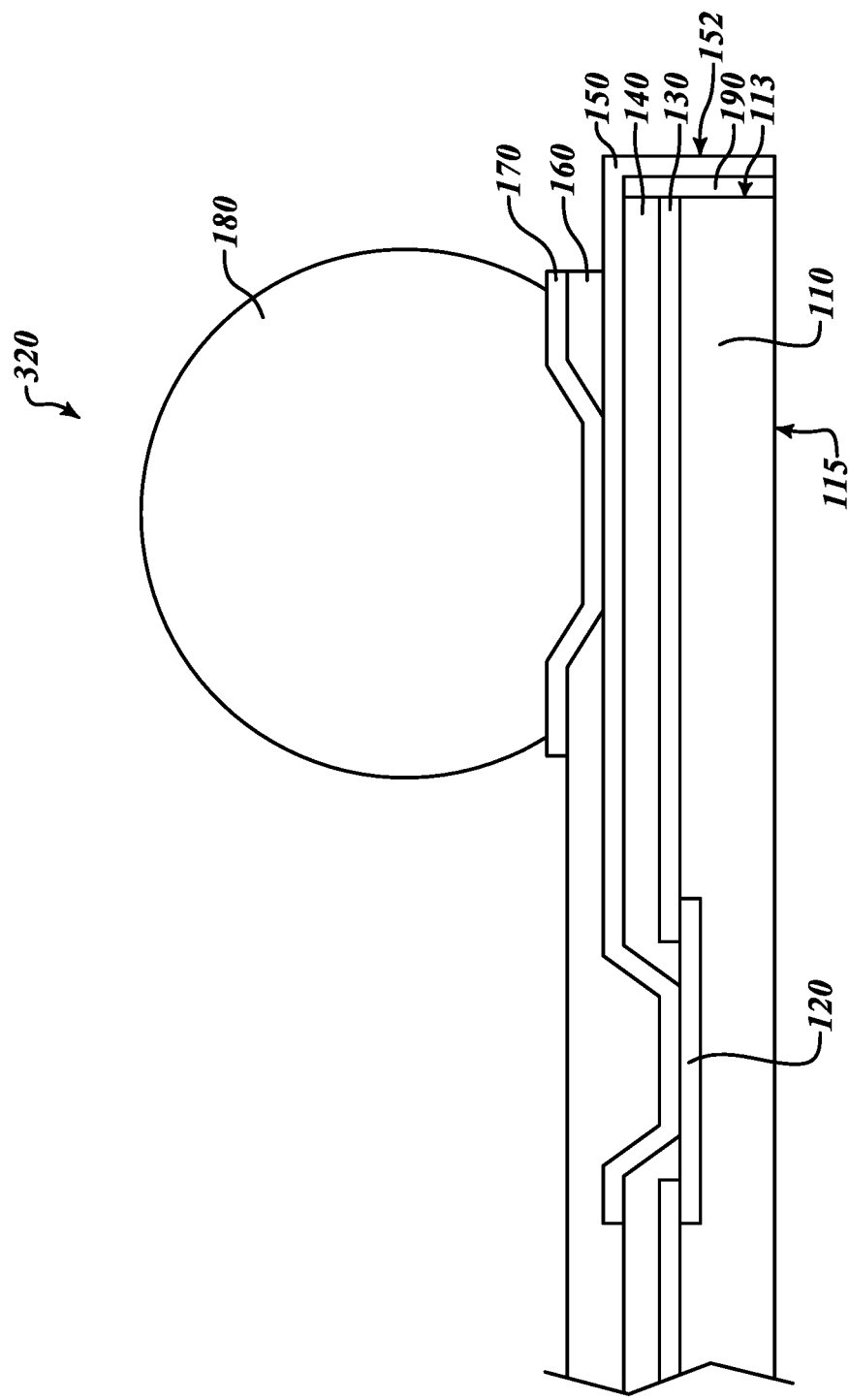

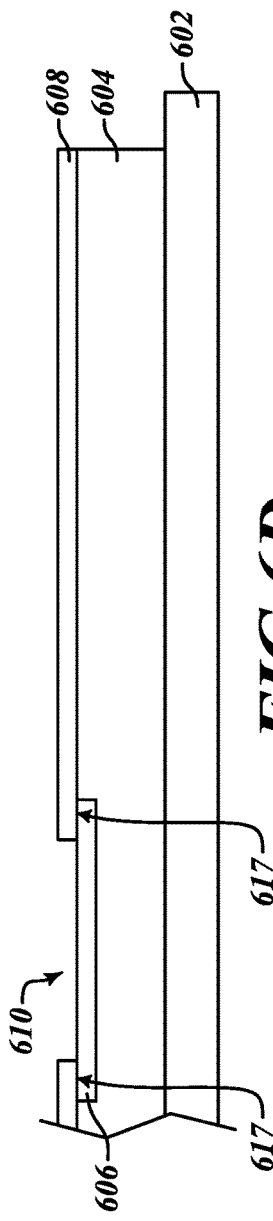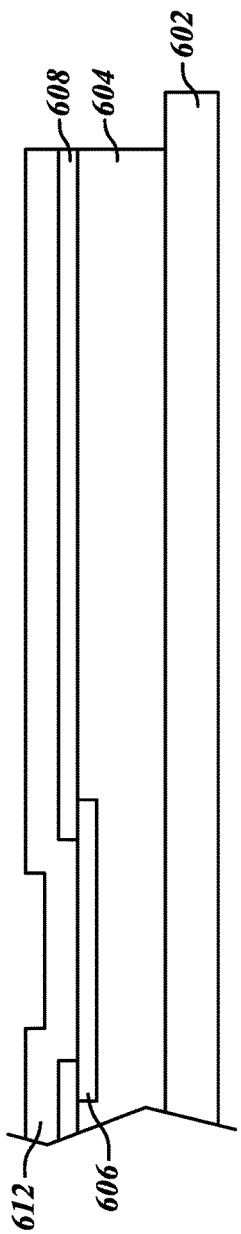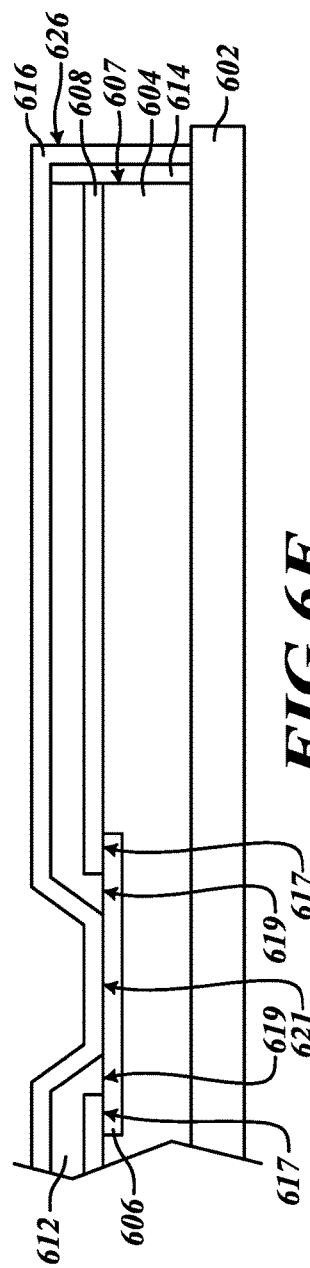

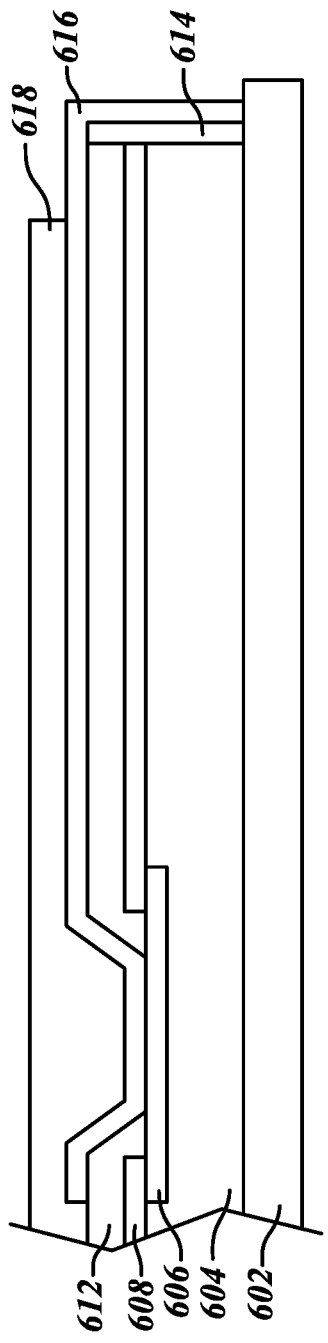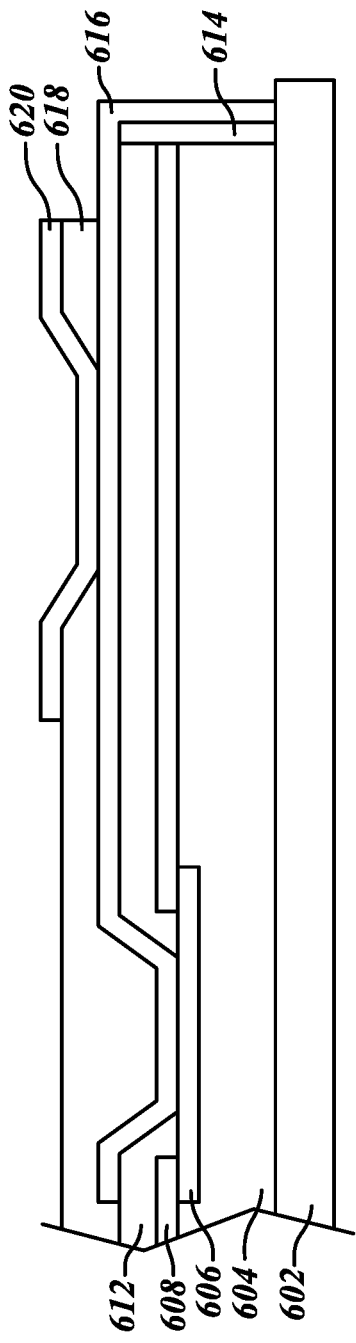

SEMICONDUCTOR PACKAGE HAVING A SIDEWALL CONNECTION

BACKGROUND

Technical Field

The present disclosure relates to a wafer level package having an extended redistribution layer formed on a sidewall of a semiconductor die for providing additional input/output terminals in the package.

Description of the Related Art

A typical semiconductor package includes input/output connections for connecting the semiconductor package with other various external circuits on a top surface. These various external circuits may include other semiconductor packages or printed circuit boards or external circuitries of any kind.

In a conventional wafer level chip scale package (WLCSP), which is a technology of packaging an integrated circuit (IC) at a wafer level, the WLCSP only provides I/O connections on the top side of the package, typically through a solder ball mounted on a semiconductor die. Such WLCSP packages limit the number of I/O connections in the package and limit the way the package can be stacked due to the I/O connections being provided only on the top side of the package.

Due to this limited application in the conventional WLCSP structure, the size of a package could not meet the industry's growing need for providing minimal sized packages.

BRIEF SUMMARY

The present disclosure is directed to a semiconductor package making use of sidewall areas of a WLCSP package to provide additional I/O connections and reduce the package size. Accordingly, a semiconductor package and a method of manufacturing such semiconductor package having additional I/O connections and minimizing the overall size of the semiconductor package is provided. That is, by expanding the number of I/O connections in the package, the semiconductor package may be horizontally and vertically stacked with other semiconductor packages or circuits by use of the proposed sidewall I/O connections.

Another aspect of the present disclosure is to provide a semiconductor package capable of providing improved interconnectivity between semiconductor packages.

Still another aspect of the present disclosure is to provide a semiconductor package capable of being stacked vertically and horizontally to increase connectivity in various directions.

Yet another aspect of the present disclosure is to provide a semiconductor package that can be stacked in a 3D structure which takes up minimal space and thereby reduces the overall size of the semiconductor device.

Another aspect of the present disclosure is to provide a method of manufacturing a semiconductor package having additional I/O connections by using the conventional wafer level chip scale package bumping process without adding additional manufacturing stages. This helps to maintain the cost of the overall manufacturing process.

BRIEF DESCRIPTION OF THE SEVERAL VIEWS OF THE DRAWINGS

For a better understanding of the embodiments, reference will now be made by way of example only to the accompanying drawings. In the drawings, identical reference numbers identify similar elements or acts. The sizes and relative positions of elements in the drawings are not necessarily drawn to scale. For example, the shapes of various elements and angles are not necessarily drawn to scale, and some of these elements may be enlarged and positioned to improve drawing legibility. Further, the particular shapes of the elements as drawn are not necessarily intended to convey any information regarding the actual shape of the particular elements, and may have been solely selected for ease of recognition in the drawings.

FIG. 2 is a top view of the semiconductor structure of FIG. 1 according to an exemplary embodiment of the present disclosure;

FIGS. 3A and 3B show examples of providing a mold protection layer according to embodiments of the present disclosure;

FIGS. 6A to 6I are cross-sectional views showing an exemplary method of making an extended redistribution layer according to an exemplary embodiment of the present disclosure;

DETAILED DESCRIPTION

Figure 1:
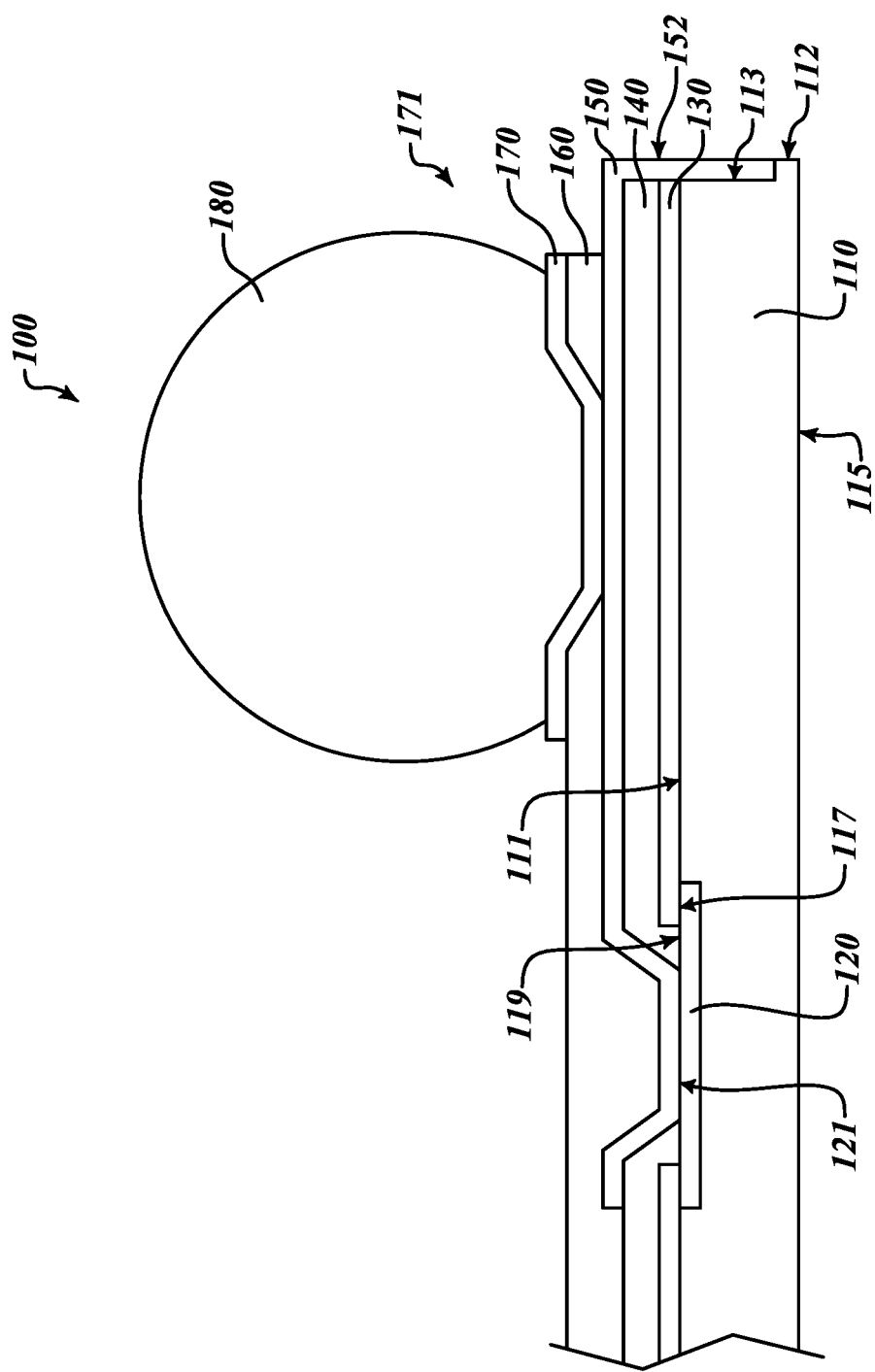
FIG. 1 is a cross-sectional view of an exemplary embodiment of a semiconductor structure according to the present disclosure having an extended redistribution layer on a sidewall of a semiconductor die.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with chip packaging or wafer level chip scale packaging (WLCSP) have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense that is as meaning "and/or" unless the content clearly dictates otherwise.

The break lines in the drawings are used to indicate that there are more elements present but are omitted for the sake of simplicity.

FIG. 1 is a cross-sectional view of a portion of semiconductor structure 100 according to an exemplary embodiment of the present disclosure. In this embodiment, the semiconductor structure 100 includes a semiconductor die 110 having a semiconductor substrate that includes a variety of active and passive circuitry, such as transistors, resistors, capacitors, logic, among other things. The semiconductor structure 100 also includes a contact pad 120, a passivation layer 130, a first dielectric layer 140, a redistribution layer 150, a second dielectric layer 160, and a conductive structure 171 including a metallization layer 170. The conductive structure 171 may be any suitable structure capable of conducting electrical signals and may be, but is not limited to, an under bump metallization (UBM) as the metallization layer 170, and a solder bump or solder ball 180. These conductive structures form a basis for providing an electrical contact, which will be explained below in detail. However, other embodiments may include fewer or more elements of the semiconductor structure according to particular design requirements.

The semiconductor die 110 is provided on a carrier substrate of a wafer (not shown). The semiconductor die 110 may have a first surface 111, a second surface 113, and a third surface 115. In one embodiment, the first surface 111 may refer to a top surface of the semiconductor die 110 as arranged in FIG. 1. The first surface, for example, may be a planar surface. The contact pad 120 may be disposed on the top surface of the semiconductor die 110. The semiconductor die 110 includes the second surface 113 which may refer to the side surface of the semiconductor die 110. In one embodiment, the first surface 111 and the second surface 113 are transverse to each other. In another embodiment, the first surface 111 and the second surface 113 are perpendicular to each other. The semiconductor die 110 also includes the third surface 115 which may refer to the bottom surface of the semiconductor die 110. The third surface 115 of the semiconductor die 110 may contact the carrier substrate of the wafer. The first surface 111 and the third surface 115 are opposite each other and may be parallel to each other. The semiconductor die 110 may be made of materials including, but not limited to, silicon (Si) or gallium arsenide (GaAs), The contact pad 120 is on the first surface 111 of the semiconductor die 110. In one embodiment, the contact pad 120 is disposed on the top surface of the semiconductor die 110. In this embodiment, the contact pad 120 may be overlain on one region of the semiconductor die 110 and does not necessarily have to have a coplanar surface with the first surface 111 of the semiconductor die 110. However, in some embodiments, to minimize the overall height and thickness of the semiconductor structure 100, the contact pad 120 may be embedded or recessed in the semiconductor die 110 and may have a coplanar top surface 111 with the semiconductor die 110. Embedding the contact pad 120 in the semiconductor die 110 may involve etching the semiconductor die 110 and depositing the contact pad 120 on the etched portion of the die 110. This contact will likely be part of the processing steps used to form the active and passive circuitry in the die. Accordingly, the contact pad 120 can be deposited on the semiconductor die 110 to a position lower than the first surface 111 of the semiconductor die 110. In one embodiment, the contact pad 120 is a metal pad and may be made of a conductive material including, but not limited to metals such as copper (Cu), aluminum (Al), etc.

The passivation layer 130 is on the semiconductor die 110. In one embodiment, the passivation layer 130 is disposed on the semiconductor die 110 and on a first portion 117 of the contact pad 120. For example, the passivation layer 130 overlaps and contacts both edge portions of the contact pad 120. The passivation layer 130 may be made of inorganic dielectric materials. For example, the passivation layer 130 may be made using silicon nitride (SiN), silicon dioxide (SiO$_2$), other dielectrics, or any compounds using the combinations of Si and N or Si and O. The passivation layer 130 serves to protect the semiconductor die 110. Depending on the design, the passivation layer 130 may be omitted.

The first dielectric layer 140 is on the passivation layer 130. In one embodiment, the first dielectric layer 140 is disposed on the passivation layer 130 and on a second portion 119 of the contact pad 120. For example, the first dielectric layer 140 overlaps and contacts the second portion 119 of the contact pad 120. In one embodiment, the first dielectric layer 140 is made of insulating materials including, but not limited to, polybenzoxazole (PBO) or polyimide (PI).

The redistribution layer 150 is on the first dielectric layer 140. In one embodiment, the redistribution layer 150 is disposed on the first dielectric layer 140 and the contact pad 120. For example, the redistribution layer 150 contacts a third portion 121 of the contact pad 120 and overlaps the passivation layer 130 and the first dielectric layer 140. In one embodiment, the redistribution layer 150 includes an extended portion 152. For example, the extended portion 152 extends to the side of the semiconductor die 110 to cover the side of the passivation layer 130 and the first dielectric layer 140. The semiconductor die 110 may include a plurality of redistribution layers 150 formed around a perimeter of the die and associated with other solder balls 180 positioned around the semiconductor die 110. In different applications, redistribution layers 150 extend along each side of the semiconductor die 110 to provide electrical contacts on ones of the sidewalls.

To explain in more detail, the extended portion 152 of the redistribution layer 150 extends along a second surface 113 of the semiconductor die 110. In one embodiment, the redistribution layer 150 extends to the second surface 113 (e.g., sidewall of the semiconductor die 110) of the semiconductor die 110 and covers the side of the passivation layer 130 and the side of the first dielectric layer 140 so that the passivation layer 130 and the first dielectric layer 140 is prevented from being directly exposed.

In one embodiment, the extended portion 152 of the redistribution layer 150 extends along a second surface 113 of the semiconductor die 110 to expose a lip portion 112 of the semiconductor die 110. For example, the redistribution layer 150 may not extend all the way down the second surface 113 (e.g., sidewall) and may cover the side of the passivation layer 130 and the side of the first dielectric layer 140, while exposing a top and side surface of the lip portion 112 of the semiconductor die 110. In another embodiment, an outer surface of the extended redistribution layer 150 may be coplanar with an outer surface of the lip portion 112 of the semiconductor die 110 as shown in FIG. 1.

In another embodiment, the extended portion 152 of the redistribution layer 150 extends all the way down the second surface 113 of the semiconductor die 110. For example, the redistribution layer 150 extends all the way down the sidewall and may cover the side of the passivation layer 130, the side of the first dielectric layer 140, and the side of the semiconductor die 110. In this embodiment, the extended redistribution layer 150 may cover over the lip portion 112 of the semiconductor die 110 to provide the entire surface as an electrical contact. Although not shown, if the extended redistribution layer 150 covers over the lip portion 112 of the semiconductor die 110, it will form a step-shape in the side of the semiconductor die 110 due to the lip portion 112.

In yet a further embodiment, the semiconductor die 110 may not have a lip portion 112 and the extended portion 152 of the redistribution layer 150 may extend all the way down the second surface 113 of the semiconductor die 110 to reach the third surface 115 of the semiconductor die 110, see FIG. 3B. For example, the side of the semiconductor die 110, and the side of the passivation layer 130, and the side of the first dielectric layer 140 may be coplanar, and the redistribution layer 150 may extend along the sidewall to entirely cover the side of the passivation layer 130, the side of the first dielectric layer 140, and the side of the semiconductor die 110. In this embodiment, the extended redistribution layer 150 may extend until it reaches the third surface 115 (e.g., the bottom surface of the semiconductor die 110) to provide an electrical contact that includes the entire second surface 113.

The second dielectric layer 160 is on the redistribution layer 150. In one embodiment, the second dielectric layer 160 overlaps the contact pad 120, the passivation layer 130, the first dielectric layer 140, and the redistribution layer 150. In one embodiment, the second dielectric layer 160 may contact only a certain region of the redistribution layer 150. The second dielectric layer 160 may be made of the same material as the first dielectric layer 140, including, but not limited to, PBO or PI, The under bump metallization (UBM) 170 is on the second dielectric layer 160. The UBM 170 is included as one of the conductive structures 171 for conducting the electrical signals. In one embodiment, the UBM 170 is in direct contact with the redistribution layer 150 in a location spaced apart from the contact pad 120. The redistribution layer 150 may be electrically and physically connected to the contact pad 120. The connection enables the conductive structures 171 to provide electrical signals to other input/output terminals such as printed circuit board (PCB) or other circuitries (not shown). In this embodiment, the UBM 170 is positioned on the second dielectric layer 160 not overlapping the contact pad 120. However, in another embodiment, the location of the UBM 170 may overlap with the contact pad 120, or be positioned in a different location according to any design requirements. The UBM 170 may be made of metal, including, but not limited to, nickel (Ni), Al, Cu, chromium (Cr), titanium (Ti), or any combinations thereof.

The solder ball 180 is on the UBM 170. The solder ball 180 is also included in the conductive structures 171 for conducting the electrical signals. The solder ball 180 may be collectively referred to as a solder ball, a solder bump, a solder joint or the like. Any structure capable of conducting electrical signals will suffice and is not limited to solder balls.

In integrated circuit packaging, the solder ball provides the electrical contact between the chip package and the PCB, which provides one electrical contact via the solder ball. However, according to the present disclosure, the redistribution layer 150 on the first dielectric layer 140 extends along the side of the semiconductor die 110 to provide a second electrical contact on the sidewalls of the semiconductor die 110. With this configuration, the chip package is capable of being stacked both vertically and horizontally. This design will improve the interconnectivity between chip modules and also save area consumption.

In addition, due to this configuration, another electrical contact is supplied on the side of the semiconductor die 110 which obviates the need to use a through-silicon via (TSV) or through-chip via, which is a vertical electrical connection that passes through a silicon die. While TSVs also provide interconnectivity in 3D packages and 3D integrated circuits, the manufacturing process involved in forming TSVs in silicon dies is complicated, difficult, and costly. Therefore, the extended redistribution layer 150 may provide a configuration that consumes less area, involves less cost, consumes less power and yet maintains high interconnect speed due to the shortened length of connections. The vertical connection will be explained in more detail in FIGS. 4 and 5.

In another embodiment, an electrical signal output to the solder ball 180 and an electrical signal output to the extended portion 152 of the redistribution layer 150 may be different. The semiconductor structure may be configured to provide two different distinct electrical signals. For example, the semiconductor structure 100 provides at least two output terminals and each of the signals output through the solder ball 180 and the extended portion of the redistribution layer 150 may be different according to design requirements.

Alternatively, in some embodiments, the electrical signal output from the solder ball 180 and the extended portion 152 will be the same.

FIG. 2 is a top view of the semiconductor structure 100 of FIG. 1 according to an exemplary embodiment of the present disclosure.

Referring to FIG. 2, the semiconductor structure 100 according to an embodiment of the present disclosure may have an extended portion of the redistribution layer 150. A cross-sectional view of the semiconductor structure 100 along the dotted lines has been explained with reference to FIG. 1. The top view of the semiconductor structure 100 only shows one ball, however the package will include a plurality of balls, some or all of which may have extended portion of the redistribution layer 150.

In FIG. 2, the solder ball 180 and the redistribution layer 150 are formed on the semiconductor die 110. The redistribution layer 150 is elongated to the side of the semiconductor die 110 to cover a portion of the sidewall of the die 110. While the sidewall area being overlapped with extended redistribution layer 150 is completely covered on the sides, the rest of the side area of the semiconductor die 110 may not be covered by the extended redistribution layer 150.

In one embodiment, the sidewall area covered by the extended redistribution layer 150 may be narrow, providing a small-sized contact area. However, in another embodiment, the sidewall area covered by the extended redistribution layer 150 may be wide, providing a large-sized contact area. Therefore, based on design needs, providing different size of contact areas is possible.

In further embodiments, not shown, the extended redistribution layer 150 may be re-routed to provide contacts at a different portion of the semiconductor die 110. By stretching the extended redistribution layer 150 to a different location in the semiconductor die 110, the second contact as provided by the extended redistribution layer 150 does not necessarily have to be on the side as shown in relations to FIGS. 1 and 2.

Figure 3A:
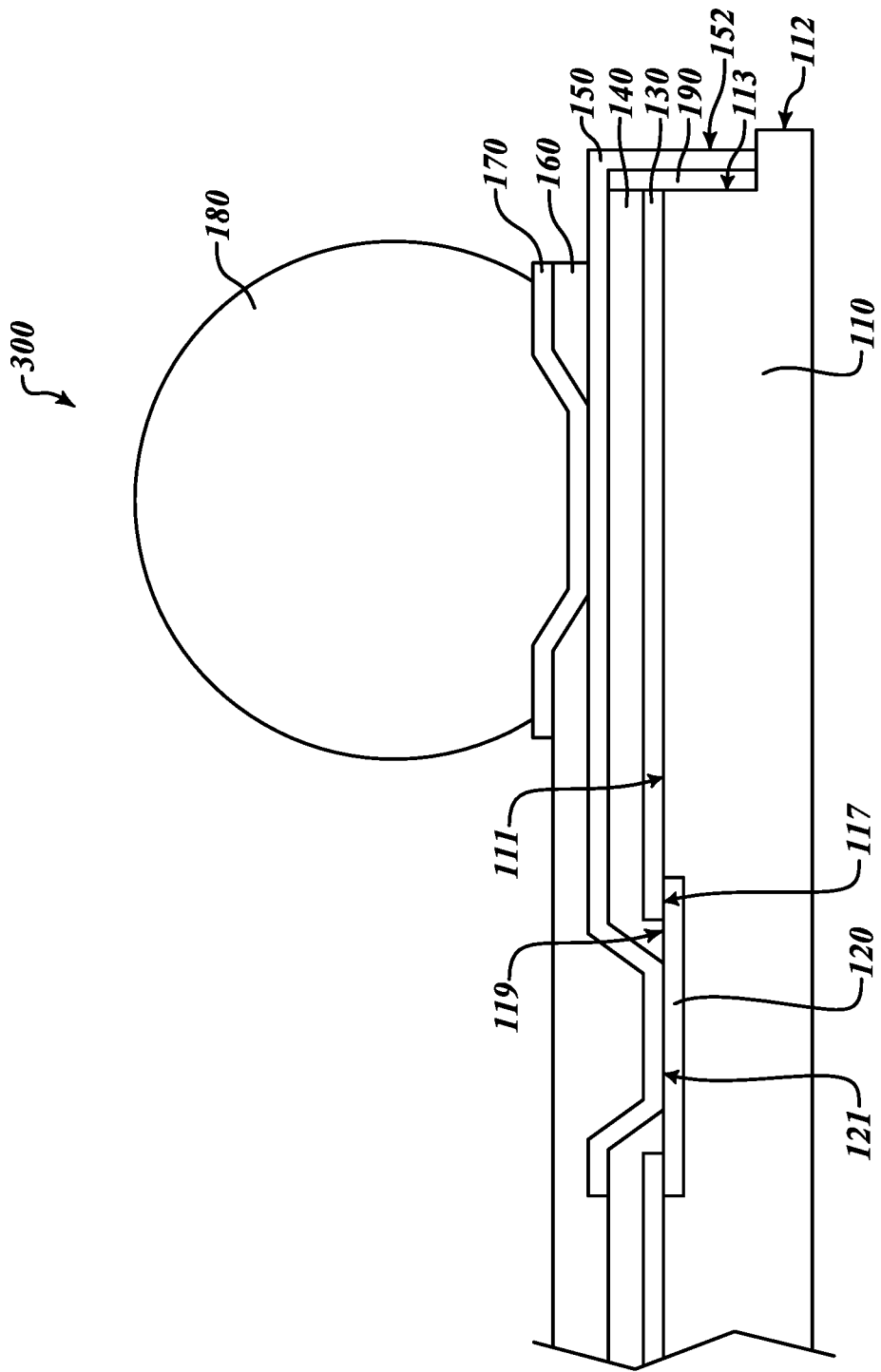

FIGS. 3A and 3B show examples of providing a mold protection layer in conjunction with the semiconductor die 110 and the extended portion 152 of the redistribution layer 150 according to embodiments of the present disclosure.

In FIG. 3A, a mold protection layer 190 is provided to cover the side of the semiconductor die 110, the side of the passivation layer 130, the side of the first dielectric layer 140. The mold protection layer 190 is positioned between the extended portion 152 of the redistribution layer 150 and the semiconductor die 110, the passivation layer 130, the first dielectric layer 140.

Referring to FIG. 3A, the semiconductor die 110 has a lip portion 112 on a carrier substrate of a wafer (not shown). The semiconductor die 110 may have a first surface 111 and a second surface 113. The lip may extend pas the second surface 113.

In one embodiment, the first surface 111 may refer to the top surface of the semiconductor die 110 and the contact pad 120 may be deposited on the first surface 111 of the semiconductor die 110. The semiconductor die 110 includes the second surface 113 which may refer to the side surface of the semiconductor die 110. In one embodiment, the first surface 111 and the second surface 113 may be transverse to each other. For example, the first surface 111 and the second surface 113 do not need to be perpendicular to each other. As such, the first and second surfaces 111, 113 may form an oblique angle with each other. However, in another embodiment, the first surface 111 and the second surface 113 may be perpendicular to each other. The semiconductor die 110 may be made of materials including, but not limited to, Si or GaAs.

The contact pad 120 is deposited on a first surface 111 of the semiconductor die 110. In one embodiment, the contact pad 120 is positioned on the top surface of the semiconductor die 110. In this embodiment, the contact pad 120 may be positioned so that the surface of the contact pad 120 is coplanar with the first surface 111 of the semiconductor die 110. However, in different embodiments, the surface of the contact pad 120 and the semiconductor die 110 do not necessarily have to be coplanar. In some embodiments, to minimize the overall height and thickness of a semiconductor structure 300, the contact pad 120 may be embedded in the semiconductor die 110 and may have a coplanar top surface with the semiconductor die 110. The contact pad 120, for example, may be a metal pad and may be made of a conductive material including, but not limited to, Cu, Al, etc.

The passivation layer 130 is deposited on the semiconductor die 110. In one embodiment, the passivation layer 130 is positioned on the semiconductor die 110 and overlaps a first portion 117 of the contact pad 120. For example, the passivation layer 130 overlays both edge portions of the contact pad 120 and contacts the contact pad 120. In this embodiment, the passivation layer 130 is deposited on the semiconductor die 110 but does not extend over to the lip portion 112 of the semiconductor die 110. The passivation layer 130 may be made of inorganic or organic dielectric materials. For example, the passivation layer 130 may be made using SiN, SiO$_2$, other dielectrics, or any compounds using the combinations of Si and N or Si and O. The passivation layer 130 serves to protect the semiconductor die 110. Depending on the design, the passivation layer 130 may be omitted.

The first dielectric layer 140 is deposited on the passivation layer 130. In one embodiment, the first dielectric layer 140 is positioned on the passivation layer 130 and overlaps a second portion 119 of the contact pad 120. For example, the first dielectric layer 140 is overlain on the second portion 119 of the contact pad 120 and contacts both the contact pad 120 and the passivation layer 130. In this embodiment, the first dielectric layer 140 is deposited on the passivation layer 130 but does not extend over to the lip portion 112 of the semiconductor die 110. The first dielectric layer 140, for example, may be made of, but is not limited to, PBO or PI.

The redistribution layer 150 is deposited on the first dielectric layer 140. In one embodiment, the redistribution layer 150 is positioned on the contact pad 120, the first dielectric layer 140, and the mold protection layer 190. For example, the redistribution layer 150 contacts a third portion 121 of the contact pad 120 and overlaps the passivation layer 130, the first dielectric layer 140 and the mold protection layer 190. In one embodiment, the redistribution layer 150 includes an extended portion 152 extending along the sidewall or the second surface 113 of the semiconductor die 110. In another embodiment, the other end of the redistribution layer 150 need not extend to the other side surface of the semiconductor die 110. That is, the redistribution layer 150 may be formed only on one side of the semiconductor die 110 according to circuit design requirements. However, in different applications, the redistribution layer 150 may extend along both sides of the semiconductor die 110 to provide electrical contacts on both of the sidewalls of the semiconductor die 110.

The extended portion 152 of the redistribution layer 150 extends along the second surface 113 of the semiconductor die 110 including the lip portion 112. In one embodiment, the redistribution layer 150 extends to the second surface 113 (e.g., sidewall of the semiconductor die 110) of the semiconductor die 110 and covers the top surface of the first dielectric layer 140 and the top and side surface of the mold protection layer 190 so that the passivation layer 130, the first dielectric layer 140 and the mold protection layer 190 is prevented from being directly exposed.

In one embodiment, the extended portion 152 of the redistribution layer 150 extends along a second surface 113 of the semiconductor die 110, but does not cover the lip portion 112 of the semiconductor die 110. For example, the redistribution layer 150 may not extend all the way down the second surface 113 (e.g., sidewall of the semiconductor die 110) and may cover the mold protection layer 190 until it reaches the top surface of the lip portion 112 of the semiconductor die 110.

In another embodiment, the extended portion 152 of the redistribution layer 150 extends along a second surface 113 of the semiconductor die 110 to expose a lip portion 112 of the semiconductor die 110. For example, the extended portion 152 of the redistribution layer 150 may be coplanar with the lip portion 112 of the semiconductor die 110. That is, the side surface of the lip portion 112 of the semiconductor die 110 may be coplanar with the extended portion 152 of the redistribution layer 150 extending along the second surface 113 (e.g., sidewall) of the semiconductor die 110.

The mold protection layer 190 is provided to cover the side of the semiconductor die 110, the side of the passivation layer 130, and the side of the first dielectric layer 140. The mold protection layer 190 can provide additional protection on top of the extended redistribution layer 150. The mold protection layer 190 is located between the extended portion 152 of the redistribution layer 150 and the semiconductor die 110, the passivation layer 130, and the first dielectric layer 140. The mold protection layer 190 is provided adjacent to the outer periphery of the semiconductor die. In one embodiment, the mold protection layer 190 surrounds the semiconductor die 110 to provide protection on the sidewalls of the semiconductor structure 300.

The mold protection layer 190 may be formed using a compression molding process to encapsulate the die with the molding compound. However, other methods can be used and is not necessarily limited to this molding process. The mold protection layer 190 can provide additional protection on top of the extended redistribution layer 150. The mold protection layer 190 is located between the side of the semiconductor die 110, the side of the passivation layer 130, the side of the first dielectric layer 140, and the extended portion of the redistribution layer 150 so that the electrical contact area on the sidewall of the semiconductor die 110 is not decreased.

In further embodiments, the mold protection layer 190 may be located to cover a portion of the extended portion 152 of the redistribution layer 150. With this configuration, the electrical contact area provided on the sidewall of the semiconductor die 110 using the extended portion 152 of the redistribution layer 150 may be decreased. For example, the mold protection layer 190 may be formed between the lip portion 112 of the semiconductor die 110 and the extended portion 152 of the redistribution layer 150 to partially cover the lower extended portion of the redistribution layer 150. However, in different embodiments, the mold protection layer 190 may be provided to cover the upper extended portion of the redistribution layer 150 or the middle extended portion of the redistribution layer 150, according to design needs.

The second dielectric layer 160 is deposited on the redistribution layer 150. In one embodiment, the second dielectric layer 160 overlaps the contact pad 120, the passivation layer 130, the first dielectric layer 140, and the redistribution layer 150. For example, the second dielectric layer 160 is located so that the layer contacts a part of the first dielectric layer 140, and a part of the redistribution layer 150. The second dielectric layer 160 may be made of the same material as the first dielectric layer 140, including, but not limited to, PBO or PI.

The UBM 170 is deposited on the second dielectric layer 160. The conductive structures 171 according to the present disclosure include, among others, UBM 170, solder ball 180, and the like, that are capable of conducting electrical signals. In one embodiment, the UBM 170 is in direct contact with the redistribution layer 150 in a location that does not overlap with the contact pad 120. The redistribution layer 150 may be electrically or physically connected to the contact pad 120 and this connection enables the conductive structures 171 to provide electrical signals to other input/output terminals such as PCB or other external circuitries (not shown). In this embodiment, the UBM 170 is positioned on the second dielectric layer 160 that does not overlap the contact pad 120. However, in another embodiment, the location of the UBM 170 may overlap with the contact pad 120 or be positioned in a different location according to any design requirements. The UBM 170 may be made of metal including, but not limited to, for example, Ni, Al, Cu, Cr, Ti, or any combinations thereof.

The solder ball 180 is mounted on the UBM 170. The solder ball 180 is also included in the conductive structures 171 for conducting the electrical signals. The solder ball 180 may be collectively referred to as a solder ball, a solder bump, a solder joint, or the like. Any structure capable of conducting electrical signals will suffice and is not limited to solder balls.

According to the present circuit packaging, the solder ball may provide a first electrical contact to chip packages or the PCB, but the extended redistribution layer 150 may also provide a second electrical contact on the sidewalls of the semiconductor die 110. With this configuration, the chip package is capable of being stacked both vertically and horizontally. This design will improve the interconnectivity between chip modules and also save area consumption.

In addition, this configuration enhances interconnectivity in 3D packages and 3D integrated circuits and reduces the complications involved in the manufacturing process because forming an extended redistribution layer 150 can be used in conventional bumping processes without adding additional manufacturing stages. For example, the extended redistribution layer 150 may be easily formed using the conventional WLCSP bump flow. Therefore, the complications involved in forming the extended redistribution layer 150 are reduced and it is less costly. Further, the extended redistribution layer 150 may provide a configuration that consumes less area, consumes less power, and yet maintains high interconnect speed due to the shortened length in connections between chip packages or to the PCB. The vertical connection will be explained in more detail in FIGS. 4 and 5.

In another embodiment, an electrical signal output to the solder ball 180 and an electrical signal output to the extended portion 152 of the redistribution layer 150 may be different. The semiconductor structure may be configured to provide two different distinct electrical signals. For example, the semiconductor structure 100 provides at least two output terminals and each of the signals output through the solder ball 180 and the extended portion of the redistribution layer 150 may be different according to design requirements.

In FIG. 3B, a mold protection layer 190 is provided to cover the side of the semiconductor die 110, the side of the passivation layer 130, and the side of the first dielectric layer 140. The mold protection layer 190 is positioned between the extended portion of the redistribution layer 150 and the semiconductor die 110, the passivation layer 130, and the first dielectric layer 140.

Referring to FIG. 3B, a semiconductor die 110 does not have a lip portion. The semiconductor die 110 not having the lip portion is provided on a carrier substrate of a wafer (not shown). For the purpose of clarity and to not obscure the subject matter of the present disclosure, repetitive explanations are omitted for those descriptions which may be easily found in connection to FIGS. 1 and 3A.

The mold protection layer 190 is provided to cover the side of the semiconductor die 110, the side of the passivation layer 130, and the side of the first dielectric layer 140. The mold protection layer 190 can provide additional protection on top of the extended redistribution layer 150 for the semiconductor die 110. The mold protection layer 190 is located between the extended portion of the redistribution layer 150 and the semiconductor die 110, the passivation layer 130, and the first dielectric layer 140. The mold protection layer 190 is provided adjacent to the outer periphery of the semiconductor die. In one embodiment, the mold protection layer 190 surrounds the semiconductor die 110 to provide protection on the sidewalls of the semiconductor structure 320.

The feature related to the mold protection layer 190 only will be detailed. The mold protection layer 190 may be formed using a compression molding process to encapsulate the die with the molding compound. However, as mentioned, another suitable molding process may be used. The mold protection layer 190 is located between the side 113 of the semiconductor die 110, the side of the passivation layer 130, the side of the first dielectric layer 140, and the extended portion 152 of the redistribution layer 150 so that the electrical contact area on the sidewall of the semiconductor die 110 is not decreased. Since the semiconductor die 110 in FIG. 3B does not have a lip portion, the mold protection layer 190 may be formed to cover all the way down until it reaches the third surface 115 of the semiconductor die 110. For example, the mold protection layer 190 may be formed to cover the entire second surface 113 of the semiconductor die 110.

The extended portion 152 of the redistribution layer 150 extends along a second surface 113 of the semiconductor die 110 and covers the mold protection layer 190. In one embodiment, the redistribution layer 150 extends to the sidewall of the semiconductor die 110 on top of the mold protection layer 190 so that the mold protection layer 190 is not directly exposed. This configuration allows the mold protection layer 190 to protect the outer boundary of the semiconductor die 110 and the extended redistribution layer 150 to have a wide contact surface on the sidewall of the semiconductor die 110.

In another embodiment, the extended portion 152 of the redistribution layer 150 extends all the way down the second surface 113 of the semiconductor die 110 to reach the third surface 115 of the semiconductor die 110. For example, the redistribution layer 150 may extend all the way down the sidewall covering the mold protection layer 190 and the bottom surface of the mold protection layer 190. If the extended redistribution layer 150 covers the mold protection layer 190 reaches the third surface 115 of the semiconductor die 110, it provides connectivity to all directions (e.g., top direction through the solder ball 180, the side direction using the extended redistribution layer 150) and increases the surface capable of supplying an electrical contact. This will improve the vertical and horizontal interconnectivity between chip packages or to other external circuitry.

Figure 4:
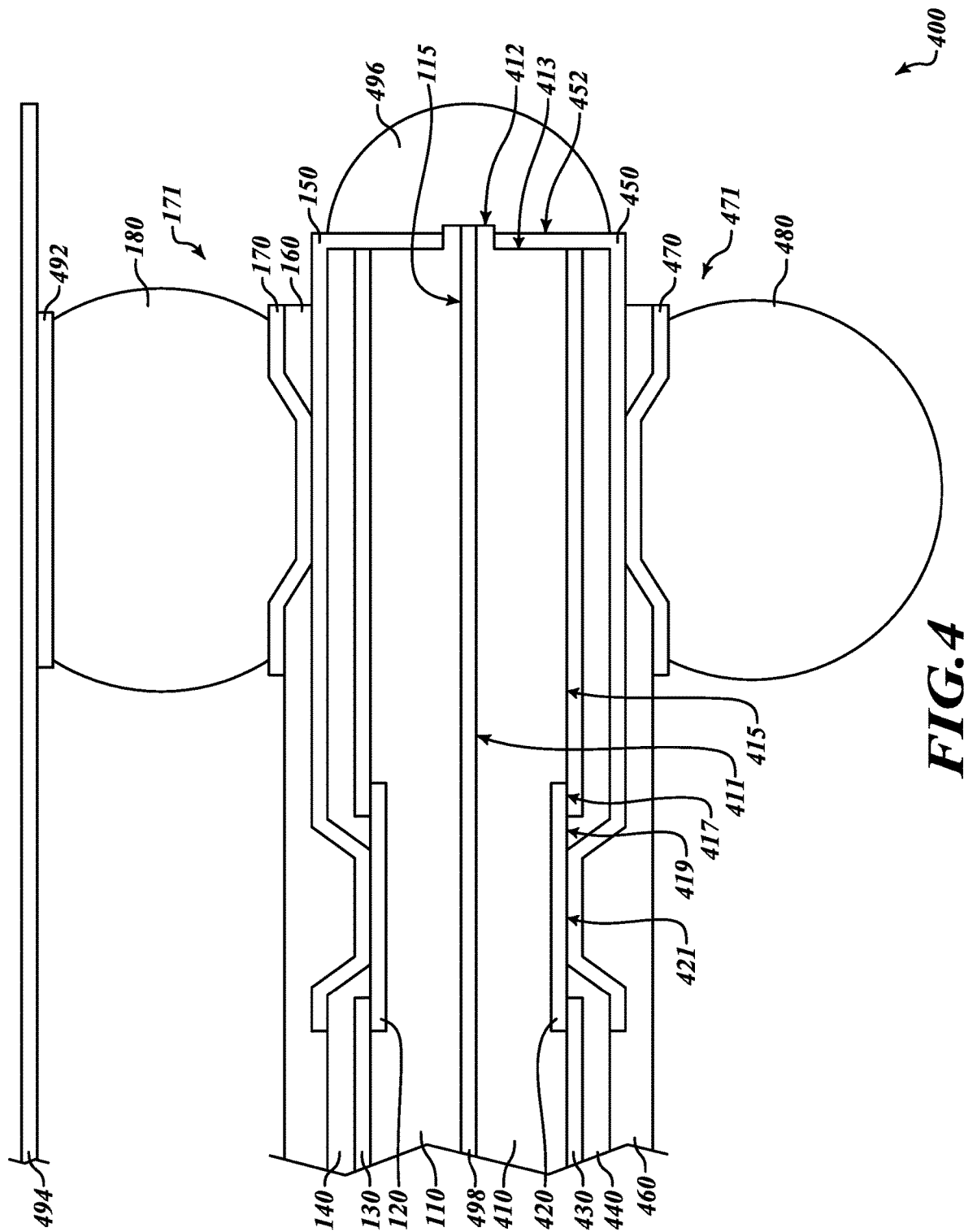
FIG. 4 shows a cross-sectional view of two semiconductor structures having a connection using a solder ball according to one embodiment of the present disclosure.

FIG. 4 shows a cross-sectional view of two semiconductor structures being connected stacked and having a solder ball on a lateral surface according to an embodiment of the present disclosure.

In FIG. 4, a portion of a package 400 includes a first semiconductor die 110 and a second semiconductor die 410 attached together via an adhesive layer 498. The adhesive layer 498 may be any suitable material for attaching silicon dies together. For example, adhesives including, but not limited to, polyimide or epoxy, may be used for adhering the two silicon dies. The first semiconductor die 110 includes a first contact pad 120, a first passivation layer 130, a first dielectric layer 140, a first redistribution layer 150, a second dielectric layer 160, a first conductive structure 171 including a first UBM 170, and a first solder ball 180. The second semiconductor die 410 includes a second contact pad 420, a second passivation layer 430, a third dielectric layer 440, a second redistribution layer 450, a fourth dielectric layer 460, a second conductive structure 471 including a second UBM 470, and a second solder ball 480. However, other embodiments may include fewer or more elements of the semiconductor structure according to particular design requirements.

The first semiconductor die 110 and other elements of the first semiconductor die 110 are formed in a similar manner as set forth in relation to FIG. 1 or 3A. Therefore, repetitive explanations of the same elements are omitted.

The first semiconductor die 110 having a first solder ball 180 may be connected to a printed circuit board (PCB) 494 using a conducting layer 492. The conducting layer 492 can provide electrical connection between the first solder ball 180 and the PCB 494. The conducting layer 492, for example, may be made of any metal capable of conducting signals including, but not limited to, Cu, Al, etc.

The second semiconductor die 410 may have a fourth surface 411, a fifth surface 413, and a sixth surface 415. In one embodiment, the fourth surface 411 may refer to the bottom surface, the fifth surface 413 may refer to the side surface, and the sixth surface 415 may refer to the top surface of the second semiconductor die 410, which in the Figure is facing a downward direction.

The second contact pad 420 may be disposed on the top surface of the second semiconductor die 410. In one embodiment, the fifth surface 413 and the sixth surface 415 may be transverse to each other. In another embodiment, the fifth surface 413 and the sixth surface 415 may be perpendicular to each other.

The second semiconductor die 410 also includes a sixth surface 415 which may correspond to the top surface of the second semiconductor die 410. In one embodiment, the fourth surface 411 and the sixth surface 415 may be opposite each other. For example, the fourth surface 411 and the sixth surface 415 may be positioned on opposing sides facing each other. In another embodiment, the fourth surface 411 and the sixth surface 415 may be parallel to each other. The second semiconductor die 410 may be made of materials including, but not limited to, Si or GaAs.

In this embodiment, the third surface 115 (e.g., bottom surface of the first semiconductor die 110) of the first semiconductor die 110 and the fourth surface 411 (e.g., bottom surface of the second semiconductor die 410) of the second semiconductor die 410 may be facing each other. For example, the third surface 115 of the first semiconductor die 110 and the fourth surface 411 of the second semiconductor die 410 may be on opposing sides and may be glued to each other using the adhesive layer 498. In other embodiments, the adhesive layer 498 may be omitted.

The second contact pad 420 is on a sixth surface 415 of the second semiconductor die 410. In one embodiment, the second contact pad 420 is disposed on the top surface of the second semiconductor die 410. In this embodiment, the second contact pad 420 may be overlain on one region of the second semiconductor die 410 and does not necessarily have to have a coplanar surface with the sixth surface 415 of the second semiconductor die 410. However, in some embodiments, to minimize the overall height and thickness of the semiconductor structure 400, the second contact pad 420 may be embedded in the second semiconductor die 410 and may have a coplanar top surface with the second semiconductor die 410. Embedding the second contact pad 420 in the second semiconductor die 410 may involve etching the second semiconductor die 410 and depositing the second contact pad 420 on the second semiconductor die 410. Accordingly, the second contact pad 420 can be deposited on the second semiconductor die 410 to a position lower than the top surface of the second semiconductor die 410. In one embodiment, the second contact pad 420 is a metal pad and is made of a conductive material including, but not limited to, Cu, Al, etc.

The second passivation layer 430 is on the second semiconductor die 410. In one embodiment, the second passivation layer 430 is disposed on the second semiconductor die 410 and on a first portion 417 of the second contact pad 420. For example, the second passivation layer 430 overlaps and contacts both edge portions of the second contact pad 420. The second passivation layer 430 may be made using SiN, $SiO_2$, other dielectrics, or any compounds using the combinations of Si and N or Si and O. The second passivation layer 430 serves to protect the second semiconductor die 410. Depending on the design, the second passivation layer 430 may be omitted.

The third dielectric layer 440 is on the second passivation layer 430. In one embodiment, the third dielectric layer 440 is disposed on the second passivation layer 430 and on a second portion 419 of the second contact pad 420. For example, the third dielectric layer 440 overlaps and contacts the second portion 419 of the second contact pad 420. In one embodiment, the third dielectric layer 440 is made of, but not limited to, PBO or PI.

The second redistribution layer 450 is on the third dielectric layer 440. In one embodiment, the second redistribution layer 450 is disposed on the third dielectric layer 440 and the second contact pad 420. For example, the second redistribution layer 450 contacts a third portion 421 of the second contact pad 420 and overlaps the second passivation layer 430 and the third dielectric layer 440. In one embodiment, the second redistribution layer 450 includes an extended portion 452. In another embodiment, the other end of the second redistribution layer 450 need not extend to the other side surface of the second semiconductor die 410. That is, the second redistribution layer 450 may be formed on only one side of the second semiconductor die 410. However, in different applications, the second redistribution layer 450 may extend along both sides of the second semiconductor die 410 to provide electrical contacts on both of the sidewalls.

The extended portion 452 of the second redistribution layer 450 extends along a fifth surface 413 (e.g., side surface) of the second semiconductor die 410. In one embodiment, the second redistribution layer 450 extends to the fifth surface 413 (e.g., sidewall of the second semiconductor die 410) of the second semiconductor die 410 and covers the side of the second passivation layer 430 and the side of the third dielectric layer 440 so that the second passivation layer 430 and the third dielectric layer 440 is prevented from being directly exposed.

In one embodiment, the extended portion 452 of the second redistribution layer 450 is extended along a fifth surface 413 of the second semiconductor die 410 to expose a lip portion 412 of the semiconductor die 410. For example, the second redistribution layer 450 may not extend all the way down the fifth surface 413 and may cover the side of the second passivation layer 430 and the side of the third dielectric layer 440, but leave open the lip portion 412 of the second semiconductor die 410.

In another embodiment, in a semiconductor die that has no lip portion 412 (e.g., both the first semiconductor die 110 and the second semiconductor die 410 may not have a lip portion similar to the die structure 320 seen in FIG. 3B), the surface of the extended second redistribution layer 450 and the surface of the extended first redistribution layer 150 may be coplanar. However, the extended second redistribution layer 450 and the extended first redistribution layer 150 may be electrically insulated with each other due to the adhesive layer 498 in between the two semiconductor dies.

In additional embodiments, the extended portion 452 of the second redistribution layer 450 extends all the way down the fifth surface 413 of the second semiconductor die 410. For example, the second redistribution layer 450 extends all the way down the sidewall and may cover the side of the second passivation layer 430, the side of the third dielectric layer 440, and the side of the second semiconductor die 410. In this embodiment, the extended second redistribution layer 450 may cover over the lip portion 412 of the second semiconductor die 410 to provide the entire surface as an electrical contact. Although not shown, if the extended second redistribution layer 450 covers over the lip portion 412 of the second semiconductor die 410, it will form a step-shape in the side of the second semiconductor die 410 due to the lip portion 412. However, the extended second redistribution layer 450 and the extended first redistribution layer 150 may still be electrically insulated with each other due to the adhesive layer 498 in between the two semiconductor dies.

The fourth dielectric layer 460 is on the second redistribution layer 450. In one embodiment, the fourth dielectric layer 460 overlaps the second contact pad 420, the second passivation layer 430, the third dielectric layer 440, and the second redistribution layer 450. In one embodiment, the fourth dielectric layer 460 may contact only a certain region of the second redistribution layer 450. The fourth dielectric layer 460 may be made of, but not limited to, the same material as the third dielectric layer 140, for example, PBO or PI.

The second UBM 470 is on the fourth dielectric layer 460. The second UBM 470 is included as one of the conductive structures 471 for conducting the electrical signals. In one embodiment, the second UBM 470 is in direct contact with the second redistribution layer 450 in a location spaced apart from the second contact pad 420. The second redistribution layer 450 may be electrically and physically connected to the second contact pad 420. In this embodiment, the second UBM 470 is positioned on the fourth dielectric layer 460 that does not overlap the second contact pad 420. However, in another embodiment, the location of the second UBM 470 may overlap with the second contact pad 420 or be positioned in a different location according to any design requirements. The second UBM 470 may be made of, but are not necessarily limited to, Ni, Al, Cu, Cr, Ti, or any combinations thereof.

The second solder ball 480 is on the second UBM 470. The second solder ball 480 is also included in the conductive structures 471 for conducting the electrical signals. The second solder ball 480 may be collectively referred to as a solder ball, a solder bump, a solder joint or the like. Any structure capable of conducting electrical signals will suffice and is not limited to solder balls. The conductive structures, such as the second solder ball 480, may provide electrical signals to other input/output terminals such as PCB or other circuitries. Although not shown in FIG. 4, the first solder ball 180 mounted on the first semiconductor die 110 is connected to the PCB 494 for providing input/output terminals. An additional PCB may be attached to the second solder ball 480 mounted on the second semiconductor die 410 according to design needs.

In wafer level packaging, the solder ball may be used to electrically connect with the chip package or the PCB. However, according to the wafer level packaging of the present disclosure, the first semiconductor die 110 and the second semiconductor die 410 are vertically stacked with each other and also provide an additional electrical contact on the second surface of the first semiconductor die 110 and the fifth surface 413 of the second semiconductor die 410. The first extended redistribution layer 150 and the second extended redistribution layer 450 may be connected through a conductive connection. The conductive connections can be any materials capable of conducting electrical signals such as metal. In one embodiment, the conductive connection includes, but is not limited to, a solder joint, a solder bump, a solder ball 496 or bonding wires 510 (shown in FIG. 5), or any like structure to provide an electrical contact on the sides. With this configuration, the chip package is capable of being stacked vertically and can be connected horizontally as well due to the electrical contact on the sidewalls. This design will improve the interconnectivity between chip modules and also save area consumption.

In FIG. 4, the conductive connection 496 connects both the first extended redistribution layer 150 and the second extended redistribution layer 450 to form a large single contact. However, in other embodiments, separate conductive connections 496 may be used for each of the extended redistribution layers 150, 450. For example, one solder ball can be separately mounted on the first extended redistribution layer 150 to form one electrical contact, and a second solder ball can be separately mounted on the second extended redistribution layer 450 to form another electrical contact. This configuration not only increases the number of electrical contacts on the side of the double stacked semiconductor structure 400, but also provides a foundation for retrieving two distinct signals from the first extended redistribution layer 150 and the second extended redistribution layer 450. In the previous embodiment where the solder ball 496 is overlain on both the first and second extended redistribution layers 150, 450, the electrical contact provided by the solder ball 496 may only have one identical signal since it is connected to both the first and second extended redistribution layers 150, 450. However, if separate solder balls are connected to each of the first and second extended redistribution layers 150, 450, there can be two separate electrical signals that may be retrieved from each of the first and second extended redistribution layers 150, 450.

In addition, this configuration enhances the interconnectivity in 3D packages and 3D integrated circuits. The manufacturing process involved in forming the extended redistribution layer is not complicated, difficult, or costly because it utilizes the conventional WLCSP process. The additional process involved is stacking the two semiconductor dies together and providing solder joints 496 on the side of the stacked semiconductor dies. The solder joint 496 provides a side connection for the two semiconductor dies 110, 410 stacked vertically. The solder joint 496 may further be used to horizontally connect any semiconductor packages or external circuitries in the horizontal direction of the semiconductor structure 400. This allows forming 3D packages that consume less area and also involves less cost. This also allows the interconnectivity to expand both vertically and horizontally. In addition, it also consumes less power due to the shortened length in connections, but maintains high interconnect speed.

In another embodiment, an electrical signal output to the first solder ball 180 and the second solder ball 480 may be different from the electrical signal output through the solder joint 496. The semiconductor structure 400 may be configured to provide different distinct electrical signals according to different design requirements.

Figure 5:
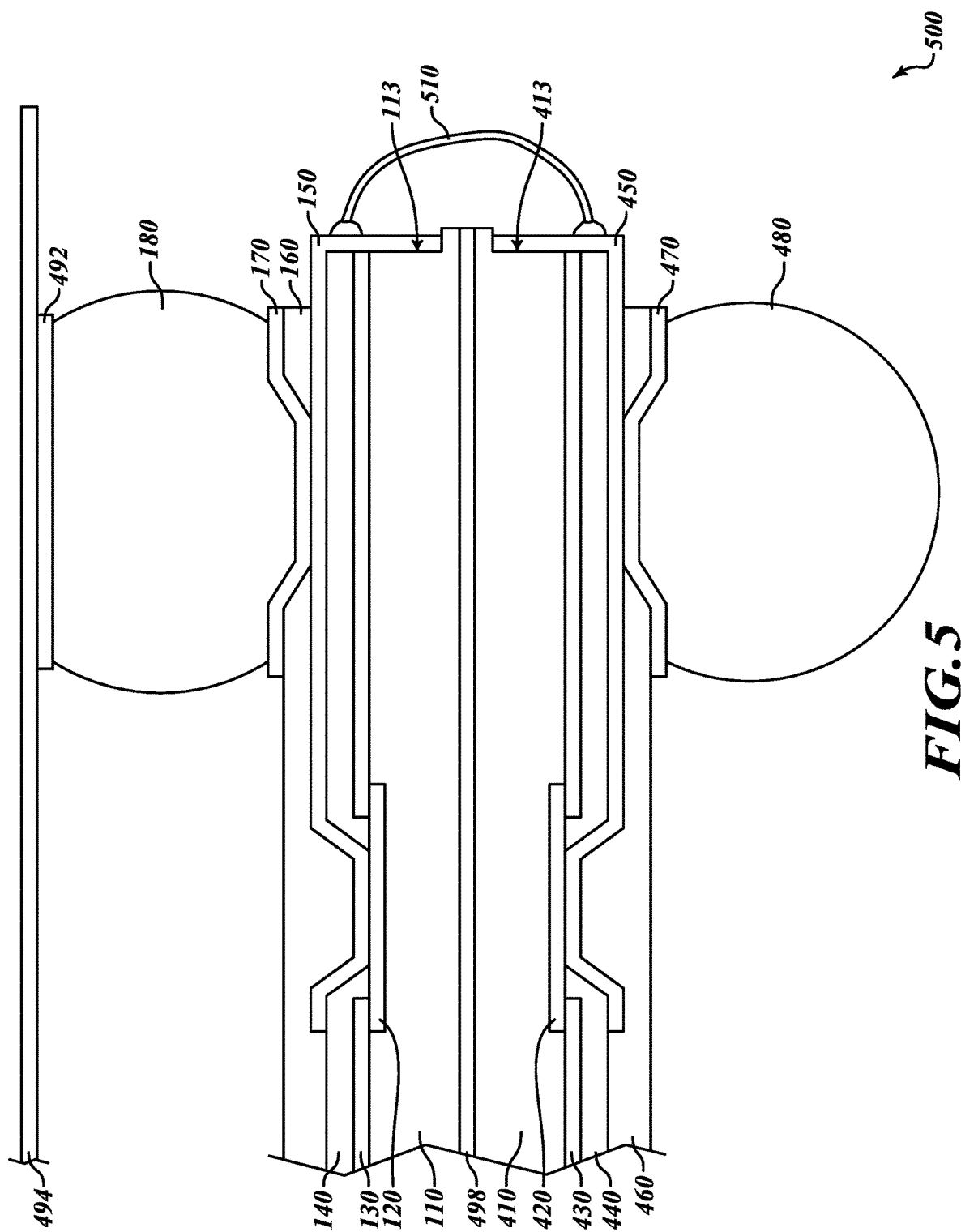
FIG. 5 shows a cross-sectional view of two semiconductor structures having a connection using wire bonding according to another embodiment of the present disclosure.

FIG. 5 shows a cross-sectional view of a semiconductor package having connection using wire bonding according to an embodiment of the present disclosure. In FIG. 5, the corresponding elements from FIG. 4 have already been explained and will not be repeated.

Referring to FIG. 5, the first semiconductor die 110 and the second semiconductor die 410 in the vertically stacked semiconductor structure 500 can be connected together using a wire bonding 510.

In vertically stacking two semiconductor dies (e.g., the first semiconductor die 110 and the second semiconductor die 410), the electrical connections between the top semiconductor die 110 and the bottom semiconductor die 410 can be made using wire bonding 510. The material used for wire bonding 510, for example, may include any metal capable of conducting electrical signals such as Cu, Al, etc. Contrary to the solder joint 496 used in FIG. 4, which can provide a large area of electrical contact, the wire bonding 510 can electrically connect the extended first redistribution layer 150 of the top die 110 and the extended second redistribution layer 450 of the bottom die 410. In other embodiments, the wire bonding 510 may be used to connect the semiconductor dies to other semiconductor packages or other external circuitries (not shown).

The vertical stacking of the semiconductor structure 500 not only improves the interconnectivity in 3D packages and 3D integrated circuits, but also saves space which enables minimization of the overall package size. The semiconductor structure 500 also improves horizontal connectivity by providing additional electrical contact on the second surface 113 of the first semiconductor die 110 and the fifth surface 413 of the second semiconductor die 410. The first extended redistribution layer 150 and the second extended redistribution layer 450 may be connected through the wire bonding 510 and this wire can be used to connect to external circuitry or PCB according to industrial needs. With this configuration, the chip package is capable of being stacked vertically and can be connected horizontally. This design will improve the interconnectivity between chip modules and also save area consumption. It also allows forming 3D packages that consumes less power due to the shortened length in connections, but maintains high interconnect speed.

In another embodiment, an electrical signal output to the first solder ball 180 and the second solder ball 480 may be different from the electrical signal output through the wire bonding 510. The semiconductor structure 500 may be configured to provide different distinct electrical signals according to different design requirements.

FIGS. 6A to 6I are cross-section views showing an exemplary method of making an extended redistribution layer according to an embodiment of the present disclosure.

Figure 6A:
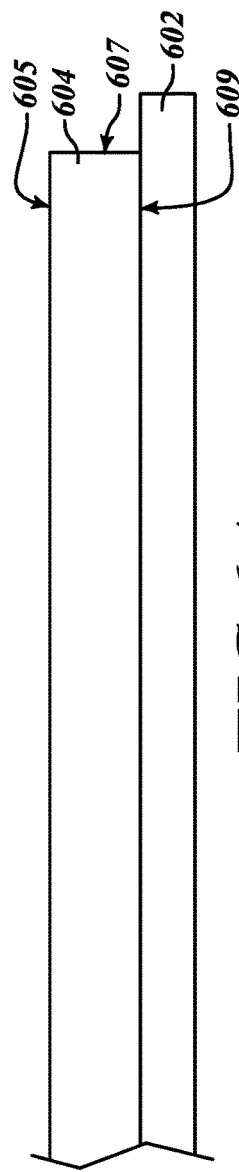

In this embodiment, the method begins in FIG. 6A with a carrier substrate 602. The semiconductor die 604 is placed on the carrier substrate 602. For example, the semiconductor die 604 is affixed on the carrier substrate 602 so that it is attached to the carrier substrate 602. The semiconductor die 604 includes a first surface 605, a second surface 607 transverse to the first surface 605, and a third surface 609 opposite the first surface 605. The first surface 605 may refer to the top surface of the semiconductor die 604. The second surface 607 may refer to the side surface of the semiconductor die 604. In another embodiment, the first surface 605 and the second surface 607 may be perpendicular to each other. In other embodiments, the angle that the first surface 605 and the second surface 607 formulate may be an oblique angle. In addition, in some embodiments, the first surface 605 and the third surface 609 may be positioned on the opposing side. For example, the first surface 605 and the third surface 609 may be parallel to each other, but do not necessarily have to be parallel. In addition, the third surface 609 and the second surface 607 may be transverse to each other. The semiconductor die 604 may be made of, but not limited to, materials such as Si or GaAs.

Figure 6B:
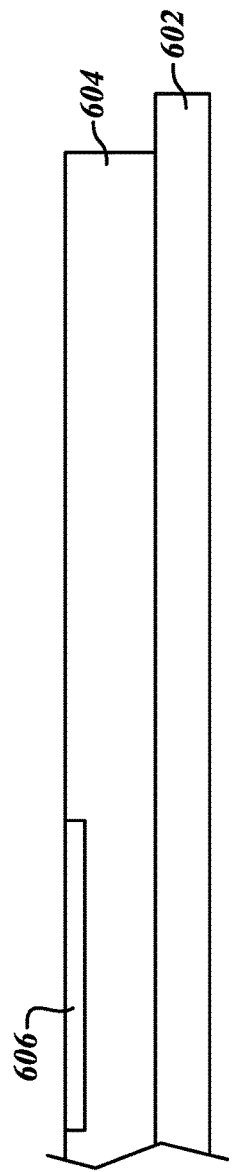

In FIG. 6B, a contact pad 606 is provided on the first surface 605 of the semiconductor die 604. In one embodiment, the contact pad 606 is disposed on the top surface of the semiconductor die 604. In this embodiment, the contact pad 606 may be overlain on one region of the semiconductor die 604 and does not necessarily have to have a coplanar surface with the first surface 605 of the semiconductor die 604. However, in some embodiments, to minimize the overall height and thickness of the semiconductor structure, the contact pad 606 may be embedded in the semiconductor die 604 and may have a coplanar top surface with the semiconductor die 604. Embedding the contact pad 606 in the semiconductor die 604 may involve etching the semiconductor die 604 and depositing the contact pad 606 on the die 604. Accordingly, in some embodiments, the contact pad 606 can be deposited on the semiconductor die 604 to a position lower than the top surface of the semiconductor die 604. In one embodiment, the contact pad 606 is a metal pad and is made of a conductive material including, but not limited to, Cu, Al, etc.

Figure 6C:
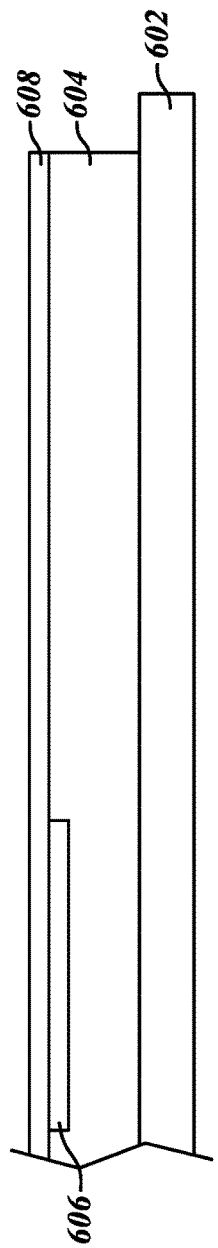

In FIG. 6C, a passivation layer 608 is provided on the semiconductor die 604 and the contact pad 606. The passivation layer 608 may be deposited on the semiconductor die 604 and the contact pad 606 using various deposition methods known in the art. For example, the passivation layer 608 is made of using SiN, $SiO_2$, other dielectrics, or any compounds using the combinations of Si and N or Si and O. The passivation layer 608 serves to protect the semiconductor die 604. Depending on the design, the passivation layer 608 may be omitted.

In FIG. 6D, the passivation layer 608 is partially removed to expose a portion of the contact pad 606. This partial removal of the passivation layer 608 creates an opening 610 and partially exposes the contact pad 606. With this removal, the passivation layer 608 overlaps a first portion 617 of the contact pad 606.

In FIG. 6E, a first dielectric layer 612 is provided on the passivation layer 608 and in the opening 610 created by the partial removal of the passivation layer 608. The first dielectric layer 612 may be deposited based on using any known deposition method in the art. For example, the first dielectric layer 612 is disposed along the passivation layer 130 and the shapes made from the opening 610. The first dielectric layer 612 is made of, but not limited to, PBO or PI.

In FIG. 6F, a redistribution layer 616 is provided on the first dielectric layer 612. Before depositing the redistribution layer 616 on the first dielectric layer 612, the first dielectric layer 612 is etched and removed to expose a portion of the contact pad 606. As a result of the removal, in one embodiment, the first dielectric layer 612 is disposed on the passivation layer 608 and on a second portion 619 of the contact pad 606. For example, the first dielectric layer 612 overlaps and contacts the second portion 619 of the contact pad 606.

In addition, after providing the first dielectric layer 612 and partially removing the first dielectric layer 612 to expose the contact pad 606, a mold protection layer 614 may be provided on the second surface 607 of the semiconductor die 604. The mold protection layer 614 is provided adjacent to the outer periphery of the semiconductor die 604. In one embodiment, the mold protection layer 614 surrounds the semiconductor die 604 to provide protection on the sidewalls of the semiconductor structure. For example, as shown, the mold protection layer 614 is positioned to cover the second surface 607 of the semiconductor die 604, the side of the passivation layer 608, and the side of the first dielectric layer 612. The process of forming the mold protection layer 614 may be performed using, for example, a compression molding process. This process is used to encapsulate the semiconductor die 604 with molding compound while the active face of the die is protected. For example, the molding compound may surround all exposed silicon die surfaces, leaving out certain surfaces of the die. In some embodiments, the process of forming the mold protection layer 614 may be omitted based on industrial design needs.

Referring back to FIG. 6F, the redistribution layer 616 is provided on a part of the contact pad 606 and the first dielectric layer 612. In one embodiment, the redistribution layer 616 is disposed on the contact pad 606, the first dielectric layer 612, and the mold protection layer 614. For example, the redistribution layer 616 contacts a third portion 621 of the contact pad 606 and overlaps the passivation layer 608, the first dielectric layer 612, and the mold protection layer 614. The second portion 619 of the contact pad 606 is located between the first portion 617 and the third portion 621 of the pad 606. In one embodiment, the redistribution layer 616 includes an extended portion 626. In this embodiment, the redistribution layer 616 extends over the mold protection layer 614, entirely covers the mold protection layer 614, and contacts the carrier substrate 602. The extended portion 626 of the redistribution layer 616 extends along a second surface 607 of the semiconductor die 604 so that the passivation layer 608, and the first dielectric layer 612, and the mold protection layer 614 are prevented from being directly exposed.

In one embodiment, the redistribution layer 616 may be formed on one side of the semiconductor die 604. However, in different embodiments, the other end of the redistribution layer 616 may extend to the other side surface of the semiconductor die 604. That is, the redistribution layer 616 may extend along both sides of the semiconductor die 604 to provide electrical contacts on both of the sidewalls.

In FIG. 6F, depositing the extended portion 626 of the redistribution layer 616 has been explained with respect to a semiconductor die 604 without a lip portion (not shown). However, the same process of forming layers on the semiconductor die 604 can be applied to dies having a lip portion. In some embodiments, where the semiconductor die has a lip portion, the redistribution layer 616 may extend along a second surface of the semiconductor die 604, and for a sidewall just above the lip portion so that the lip portion of the semiconductor die 604 is exposed. For example, the redistribution layer 616 may not extend all the way down the second surface 607 (e.g., sidewall) and cover the lip portion of the semiconductor die 604. It may extend to cover the side of the mold protection layer 614 covering the side of the passivation layer 608 and the side of the first dielectric layer 612, but will leave open the lip portion of the semiconductor die 604.

In FIG. 6G, the second dielectric layer 618 is provided on the redistribution layer 616. In one embodiment, the second dielectric layer 618 overlaps the contact pad 606, the passivation layer 608, the first dielectric layer 612, and the redistribution layer 616. In one embodiment, the second dielectric layer 160 may be in contact with only a partial region of the redistribution layer 616. The second dielectric layer 618 may be made of the same material as the first dielectric layer 612 and may be deposited using the same method. The second dielectric layer 618 may be made of, but is not limited to, materials such as PBO or PI, In FIG. 6H, an UBM 620 is provided on the second dielectric layer 618. In one embodiment, the UBM 620 is in direct contact with the redistribution layer 616 in a location spaced apart from the contact pad 606. For example, the redistribution layer 616 may be electrically and physically connected to the contact pad 606. The connection enables the conductive structures such as UBM 620 to provide electrical signals to other input/output terminals such as PCB or other external circuitries (not shown). In this embodiment, the UBM 620 is positioned on the second dielectric layer 618 that does not overlap the contact pad 606. However, in another embodiment, the location of the UBM 620 may overlap with the contact pad 606 or be positioned in a different location according to any design requirements. For example, the UBM 620 may be made of metal, including, but not limited to, for example, Ni, Al, Cu, Cr, Ti, or any combinations thereof.

Figure 6I:
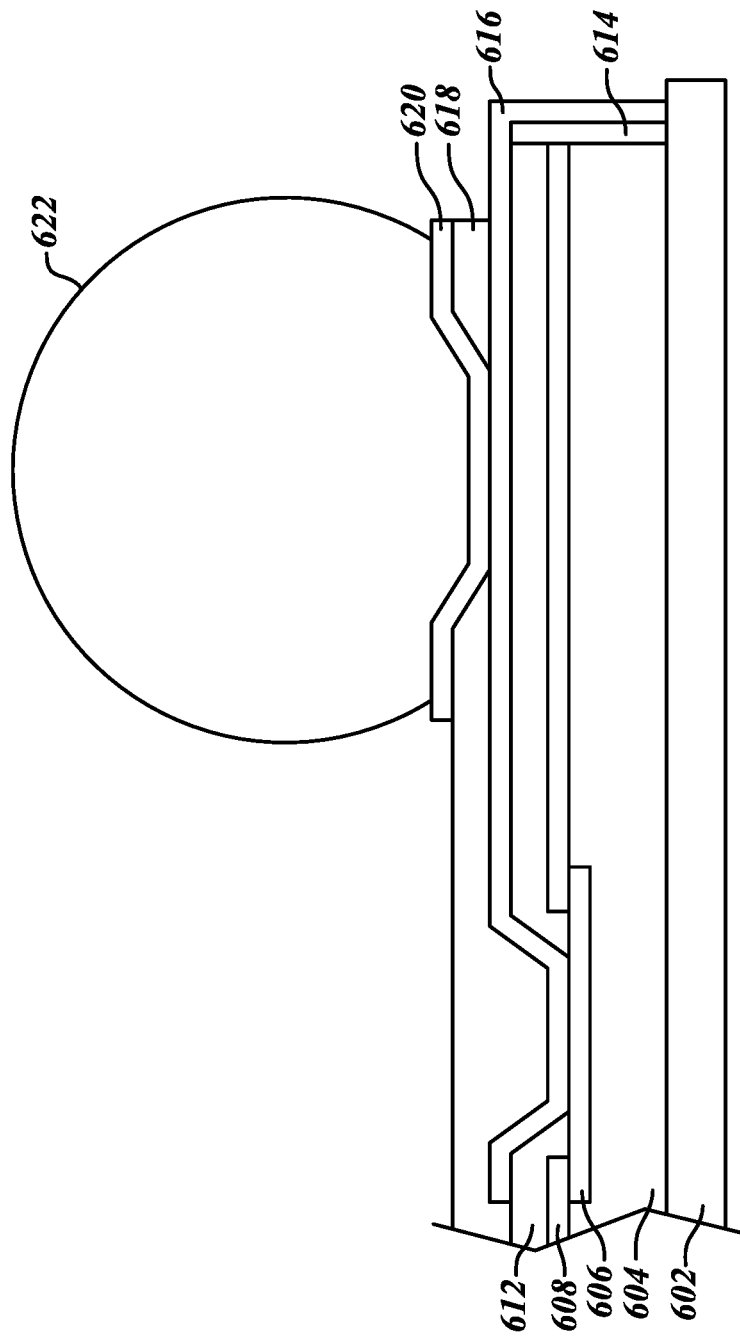

In FIG. 6I, a solder ball 622 is provided on the UBM 620. The solder ball 622 may include any conducting materials capable of conducting electrical signals and may include, for example, a solder bump, a solder joint, a wire bonding, or the like. Any structure capable of conducting electrical signals will suffice and is not limited to solder balls.

Figure 7:
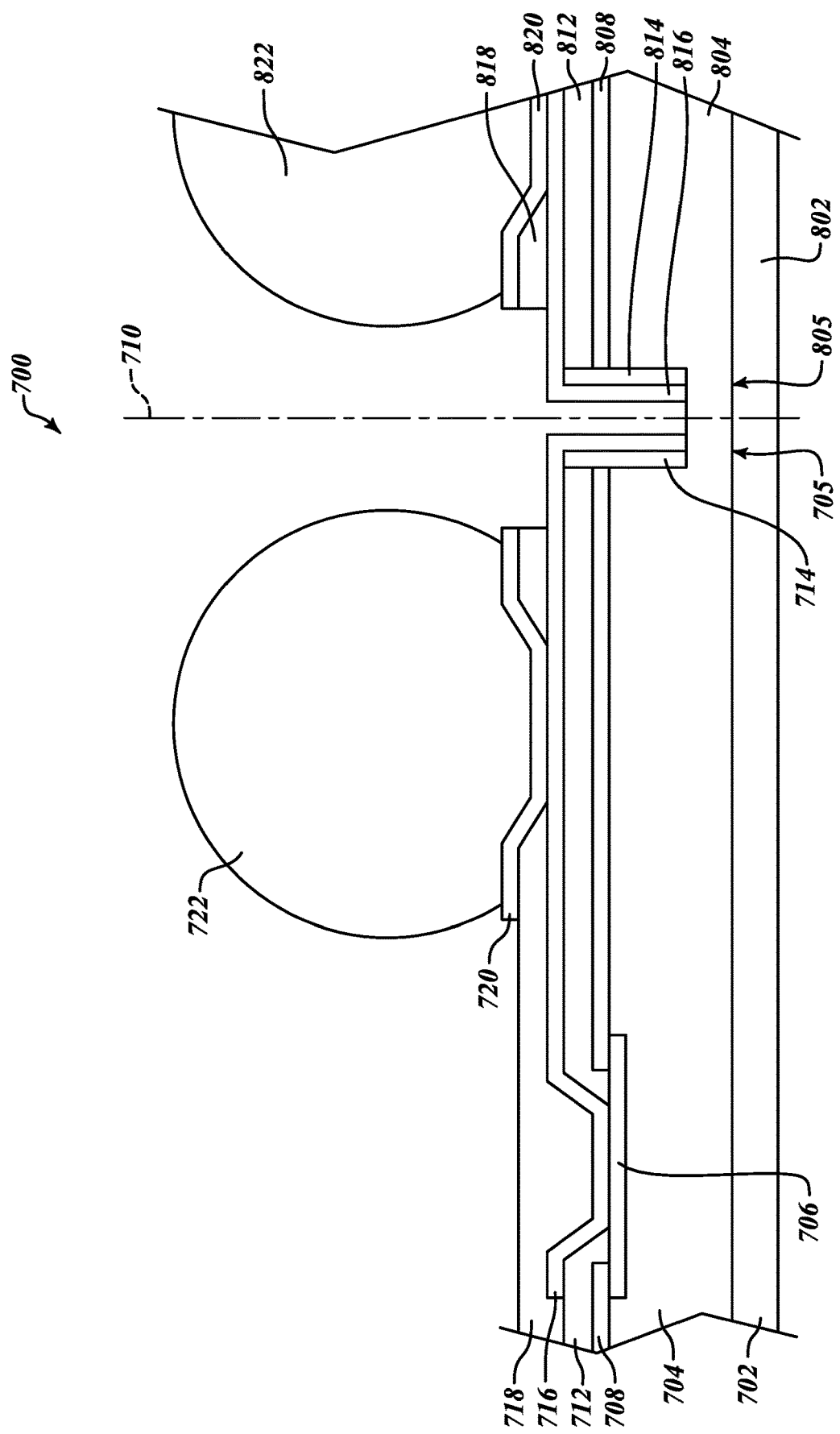
FIG. 7 shows a cross-sectional view of scribing adjacent semiconductor structures according to embodiments of the present disclosure.

FIG. 7 shows a cross-sectional view of scribing adjacent semiconductor structures according to embodiments of the present disclosure.

In FIG. 7, a semiconductor structure 700 is shown having two silicon dies, a first semiconductor die 704 and a second semiconductor die 804 placed adjacent to each other. It will be apparent to a person of ordinary skill in the art that there will be a plurality of semiconductor dies mounted on the carrier substrate of the wafer 702, 802. In this embodiment, as shown in FIG. 7, the two silicon dies are affixed on the carrier substrate. The first semiconductor die 704 is affixed on the first carrier substrate 702 and the second semiconductor die 804 is affixed on the second carrier substrate 802. The first carrier substrate 702 and the second carrier substrate 802 may be identical and may form a large, single carrier substrate. The carrier substrate may have a plurality of semiconductor dies placed on top of the carrier substrate.

The semiconductor structure built on top of the carrier substrate 802 may be formed based on the same or similar process that was used to form the semiconductor structure built on top of the carrier substrate 702. For example, the contact pad (not shown), the passivation layer 808, the first dielectric layer 812, the mold protection layer 814, the redistribution layer 816, the second dielectric layer 818, the UBM 820, and the solder ball 822 may be formed in a same or similar manner as explained in previous embodiments.

In other embodiments, the process of forming a contact pad 706, the passivation layer 708, the first dielectric layer 712, the mold protection layer 714, the redistribution layer 716, the second dielectric layer 718, the UBM 720, the solder ball 722 and etc. on the semiconductor die 704 may be in a single, uniform process for the plurality of semiconductor dies mounted on the carrier substrate. For example, the aforementioned elements and layers may be formed in a single process for each of the plurality of semiconductor dies mounted on the carrier substrate. Accordingly, the same elements and layers formed on the semiconductor die 704 will be formed on the adjacent semiconductor die 804 and any other plurality of semiconductor dies mounted on the carrier substrate 702, 802. For example, the passivation layer 708 in the first semiconductor die 704 may be formed in the same process as the passivation layer 808 in the second semiconductor die 804. The passivation layer for all of the other semiconductor dies (not shown) on the carrier substrate 702, 802 may be formed in the same single process as well.

One exemplary method of forming an extended redistribution layer on a semiconductor die is forming the redistribution layer on each of the plurality of semiconductor dies on a reconstructed wafer. In the reconstructed wafer, the plurality of semiconductor dies are mounted on the reconstructed wafer and spaced away from each of the plurality of semiconductor dies. The processes of forming the various layers on top of the plurality of semiconductor dies involved are as explained in connection with previous embodiments. After the various layers (e.g., the contact pad, the passivation layer, the first dielectric layer, the mold protection layer, the redistribution layer, the second dielectric layer, the UBM, the solder ball, etc.) are formed, the semiconductor die having a redistribution layer and the adjacent semiconductor die having a redistribution layer are picked and demounted from the carrier substrate (not shown).

In other embodiments, the semiconductor dies may have a lip portion 705, 805, and the lip portion 705 of one semiconductor die 704 may be connected to the lip portion 805 of the adjacent semiconductor die 804 as shown in FIG. 7. For these semiconductor dies, another exemplary method of forming an extended redistribution layer on a semiconductor die may be used. This exemplary method includes forming the redistribution layer on each of the plurality of semiconductor dies on a half cut wafer and scribing the lip portion of each of the adjacent semiconductor dies.

For example, in FIG. 7, the first semiconductor die 704 is connected to the second semiconductor die 804 through their respective lip portion 705, 805. The processes of forming the various layers on the first semiconductor die 704 and the second semiconductor die 804 involves the same, similar process as explained in connection with the relevant previous embodiments. After the various layers (e.g., the contact pad, the passivation layer, the first dielectric layer, the mold protection layer, the redistribution layer, the second dielectric layer, the UBM, the solder ball, etc.) are formed, the first semiconductor die 704 and the adjacent second semiconductor die 804 are cut along the scribe line 710. The scribe line 710 cuts between the lip portion 705 of the first semiconductor die 704 and the lip portion 805 of the second semiconductor die 804. After the cut is made on the half cut wafer along the scribe line 710, the first semiconductor die 704 and the adjacent second semiconductor die 804 are separated. The other plurality of semiconductor dies mounted on the carrier substrate is cut in the similar manner. After each of the plurality of semiconductor dies are singulated into individual semiconductor dies, the individual dies are demounted from the carrier substrate 702, 802. The individual semiconductor dies all include an extended redistribution layer which allows achieving a large contact area at the chip sidewall.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a semiconductor die including a first surface, a second surface opposite to the first surface, a first sidewall surface transverse to the first and second surfaces;
   a contact pad exposed from the first surface;
   a first dielectric layer on the contact pad and extending from the contact pad to the first sidewall surface, the first dielectric layer including a second sidewall surface coplanar with the first sidewall surface;
a second dielectric layer on the contact pad and extending from the contact pad to the first and second sidewall surfaces, the second dielectric layer having a third sidewall surface coplanar with the first and second sidewall surfaces, the second dielectric layer having a surface facing away from the semiconductor die;
a mold protection layer on and covering the first, second, and third sidewall surfaces, the mold protection layer having an end surface facing away from the semiconductor die and a fourth sidewall surface transverse to the end surface of the mold protection layer;
a redistribution layer on the contact pad and extending from the contact pad to the mold protection layer, the redistribution layer covering the surface of the dielectric layer, the end surface of the mold protection layer, and the sidewall surface of the mold protection layer; and
a third dielectric layer on the redistribution layer and on the second dielectric layer, the third dielectric layer overlaps the contact pad and the first dielectric layer.

2. The device of claim 1, further comprising a conductive layer extending into the third dielectric layer to the redistribution layer, the conductive layer being coupled to the redistribution layer.

3. The device of claim 2, wherein the conductive layer is an under bump metallization.

4. The device of claim 3, further comprising a solder ball coupled to the under bump metallization.

5. The device of claim 4, further comprising a printed circuit board including a contact pad coupled to the solder ball.

6. The device of claim 1, wherein the redistribution layer is spaced apart from the first sidewall surface, the second sidewall surface, and the third sidewall surface by the mold protection layer.

7. The device of claim 1, further comprising a solder material coupled to a portion of the redistribution layer on the sidewall surface of the mold protection layer.

8. A device, comprising:
a semiconductor die having a first surface, a second surface transverse to the first surface, and a third surface opposite the first surface, the second surface between the first surface and the third surface, the semiconductor die including a contact pad exposed from the first surface;
a first dielectric layer on the first surface of the semiconductor die, the first dielectric layer extending from the contact pad to the second surface of the semiconductor die;
a redistribution layer on the first and second surfaces of the semiconductor die, the redistribution layer being on the first dielectric layer and on the contact pad;
a second dielectric layer on the first surface of the semiconductor die, the second dielectric layer being on the redistribution layer and the first dielectric layer; and
a conductive structure on the first surface of the semiconductor die, the conductive structure extends through the second dielectric layer to the redistribution layer, and the conductive structure is on the redistribution layer and the second dielectric layer.

9. The device of claim 8, wherein the conductive structure includes an under bump metallization extending into the second dielectric layer to the redistribution layer, and the under bump metallization coupled to the redistribution layer.

10. The device of claim 9, wherein the conductive structure further includes a solder structure coupled to the under bump metallization.

11. The device of claim 10, wherein:
the semiconductor die further includes a lip portion that extends past the mold protection layer to the redistribution layer, the lip portion being transverse to the second surface;
the mold protection layer having an end on the lip portion; and
the redistribution layer having an end on the lip portion.

12. The device of claim 11, further comprising a mold protection layer on the second surface between the redistribution layer and the second surface, the mold protection layer spaces the redistribution layer from the second surface.

13. A device, comprising:
a first semiconductor die structure including:
a first semiconductor die including a first surface, a first sidewall transverse to the first surface, a second surface opposite to the first surface, a first contact pad at the first surface, and a first lip portion extending outward from the first sidewall, the first lip portion being at the first sidewall and the first sidewall extends from the first lip portion to the first surface;
a first passivation layer on the first surface of the semiconductor die and on the first contact pad, the first passivation layer including a second sidewall coplanar with the first sidewall;
a first dielectric layer on the first passivation layer and on the first contact pad, the first dielectric layer including a third sidewall coplanar with the first and second sidewalls; and
a first redistribution layer including:
a first portion on the first contact pad, the first portion extending along the first dielectric layer in a first direction from the first contact pad to the first, second, and third sidewalls, the first direction being transverse to the first, second, and third sidewalls; and
a second portion overlapping the first, second, and third sidewalls and extending to the first lip portion, the second portion extending in a second direction transverse to the first direction, the first surface, and the second surface.

14. The device of claim 13, wherein:
the first lip portion includes an end surface transverse to the first surface and the second surface; and
the second portion includes a contact surface transverse to the first surface and the second surface, the contact surface coplanar with the end surface of the first lip portion.

15. The device of claim 13, further comprising a mold protection layer that physically contacts and covers the first, second, and third sidewalls, the mold protection layer is between the second portion and the first, second, and third sidewalls.

16. The device of claim 15, wherein the mold protection layer extends along the first, second, and third sidewalls to the first lip portion.

17. The device of claim 13, wherein:
the second portion includes a contact surface transverse to the first surface and the second surface; and
the first lip portion includes an end surface transverse to the first surface and the second surface, the first lip portion extends past the contact surface of the second portion, and the end surface of the first lip portion is further away from the first, second, and third sidewalls relative to the contact surface.

18. The device of claim 13, wherein a mold protection layer extends along the first, second, and third sidewalls to the first lip portion, and the mold protection layer is between the second portion and the first, second and third sidewalls.

19. The device of claim 18, wherein:
the second portion includes a contact surface transverse to the first surface and the second surface; and
the first lip portion includes an end surface transverse to the first surface and the second surface, the first lip portion extends past the contact surface of the second portion, and the end surface of the first lip portion is further away from the first, second, and third sidewalls relative to the contact surface.

20. The device of claim 13, further comprising:
a second semiconductor die structure coupled to the first semiconductor die structure by an adhesive layer, the second semiconductor die structure including:
  a second semiconductor die including a third surface, a fourth sidewall transverse to the third surface, a fourth surface opposite to the third surface, a second contact pad at the third surface, and a second lip portion extending outward from the fourth sidewall, the second lip portion being at the fourth sidewall and the fourth sidewall extends from the second lip portion to the third surface;
  a second passivation layer on the third surface of the second semiconductor die and on the second contact pad, the second passivation layer including a fifth sidewall coplanar with the fourth sidewall;
  a second dielectric layer on the second passivation layer and on the second contact pad, the second dielectric layer including a sixth sidewall coplanar with the fourth and fifth sidewalls; and
  a second redistribution layer including:
    a third portion on the second contact pad, the third portion extending along the second dielectric layer in the first direction from the second contact pad to the fourth, fifth, and sixth sidewalls, the first direction being transverse to the fourth, fifth, and sixth sidewalls; and
  a fourth portion overlapping the fourth, fifth, and sixth sidewalls and extending to the second lip portion, the second portion extending in the second direction transverse to the first direction, the third surface, and the fourth surface.

* * * * *

UNITED STATES PATENT AND TRADEMARK OFFICE
CERTIFICATE OF CORRECTION

| | | |
|---|---|---|
| PATENT NO. | : 11,749,627 B2 | |
| APPLICATION NO. | : 17/513541 | |
| DATED | : September 5, 2023 | |
| INVENTOR(S) | : Endruw Jahja et al. | |

It is certified that error appears in the above-identified patent and that said Letters Patent is hereby corrected as shown below:

In the Claims

Column 22, Line 4, cancel text beginning with "11. The device of claim 10, wherein:" to and ending with "layer from the second surface." in Line 15, and insert the following:

--11. The device of claim 8, further comprising a mold protection layer on the second surface between the redistribution layer and the second surface, the mold protection layer spaces the redistribution layer from the second surface.

12. The device of claim 11, wherein:
the semiconductor die further includes a lip portion that extends past the mold protection layer to the redistribution layer, the lip portion being transverse to the second surface;
the mold protection layer having an end on the lip portion; and
the redistribution layer having an end on the lip portion.--

Signed and Sealed this
Twenty-first Day of November, 2023

Katherine Kelly Vidal
*Director of the United States Patent and Trademark Office*